(12) United States Patent
Liu et al.

(10) Patent No.: US 11,152,432 B1
(45) Date of Patent: Oct. 19, 2021

(54) PIXEL STRUCTURE, OLED DISPLAY DEVICE AND DRIVING METHOD

(71) Applicant: KUNSHAN GO-VISIONOX OPTO-ELECTRONICS CO., LTD., Kunshan (CN)

(72) Inventors: Mingxing Liu, Kunshan (CN); Jiayao Sun, Kunshan (CN); Junfeng Li, Kunshan (CN); Feng Gao, Kunshan (CN); Dongyun Lv, Kunshan (CN); Xuliang Wang, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 507 days.

(21) Appl. No.: 16/324,992

(22) PCT Filed: Aug. 2, 2018

(86) PCT No.: PCT/CN2018/098354
§ 371 (c)(1),
(2) Date: Feb. 12, 2019

(87) PCT Pub. No.: WO2019/042072
PCT Pub. Date: Mar. 7, 2019

(30) Foreign Application Priority Data

Aug. 31, 2017 (CN) .......................... 201710774606.4
Aug. 31, 2017 (CN) .......................... 201710775349.6
Aug. 31, 2017 (CN) .......................... 201710776295.5

(51) Int. Cl.
*G09G 3/30* (2006.01)
*H01L 27/32* (2006.01)
*G09G 3/3208* (2016.01)

(52) U.S. Cl.
CPC ....... *H01L 27/3218* (2013.01); *G09G 3/3208* (2013.01); *H01L 27/3216* (2013.01);
(Continued)

(58) Field of Classification Search
CPC .. G09G 3/32; G09G 3/30; G09G 3/34; G09G 3/36; G09G 5/00; G09G 3/3208;
(Continued)

(56) References Cited

U.S. PATENT DOCUMENTS 8,994,056 B2   3/2015  Edwards
2008/0225212 A1  9/2008  Ong
(Continued)

FOREIGN PATENT DOCUMENTS

CN   102262854 A   11/2011
CN   102714213 A   10/2012
(Continued)

OTHER PUBLICATIONS

Office Action dated Mar. 30, 2021 in corresponding Korean Application No. 10-2019-7032742; 15 pages including English-language translation.
(Continued)

*Primary Examiner* — Pegeman Karimi
(74) *Attorney, Agent, or Firm* — Maier & Maier, PLLC

(57) ABSTRACT

A pixel structure, an Organic Light-Emitting Diode (OLED) display device, and a driving method. The pixel structure includes a number of pixel units arranged in a matrix form. Each pixel unit includes two pixel subunits adjacently arranged along a first direction and includes three sub-pixels having different colors. The two pixel subunits constitute two pixels adjacently arranged along the second direction. A distance between centers of two sub-pixels having a same color in two pixels not adjacent in three consecutive pixels in the second direction is 2 or 2N/(N+1) times of a distance
(Continued)

between the centers of two sub-pixels having the same color in two adjacent pixels in the first direction. N is an integer greater than or equal to 1.

19 Claims, 11 Drawing Sheets

(52) U.S. Cl.
CPC ............... *G09G 2300/0452* (2013.01); *G09G 2300/0465* (2013.01)

(58) Field of Classification Search
CPC .... G09G 2300/0452; G09G 2300/0465; H01L 27/3218; H01L 27/3216
See application file for complete search history.

(56) References Cited

U.S. PATENT DOCUMENTS

| | | | |
|---|---|---|---|
| 2012/0049726 A1* | 3/2012 | Yoo | H01L 27/3216 313/504 |
| 2012/0056531 A1* | 3/2012 | Park | G09G 3/3233 313/506 |
| 2012/0092238 A1 | 4/2012 | Hwang et al. | |
| 2012/0313843 A1 | 12/2012 | Kondoh et al. | |
| 2013/0002118 A1* | 1/2013 | Ko | G09G 3/3208 313/1 |
| 2014/0097760 A1* | 4/2014 | Kato | H05B 45/00 315/192 |
| 2015/0187293 A1* | 7/2015 | Yoo | G09G 3/3614 345/694 |
| 2015/0371583 A1 | 12/2015 | Guo et al. | |
| 2016/0049110 A1 | 2/2016 | Shi et al. | |
| 2016/0126296 A1 | 5/2016 | Feng | |
| 2016/0196777 A1 | 7/2016 | Liu et al. | |
| 2016/0203800 A1 | 7/2016 | Chen et al. | |
| 2016/0284769 A1 | 9/2016 | Chien et al. | |
| 2016/0293084 A1 | 10/2016 | Guo et al. | |
| 2016/0329026 A1 | 11/2016 | Lu et al. | |
| 2016/0343284 A1 | 11/2016 | Sun | |
| 2017/0236883 A1 | 8/2017 | Madigan | |
| 2019/0073938 A1 | 3/2019 | Shi | |

FOREIGN PATENT DOCUMENTS

| | | | |
|---|---|---|---|
| CN | 102770901 | A | 11/2012 |
| CN | 103123927 | A | 5/2013 |
| CN | 103208507 | A | 7/2013 |
| CN | 203260585 | U | 10/2013 |
| CN | 103886825 | A | 6/2014 |
| CN | 103943032 | A | 7/2014 |
| CN | 104037202 | A | 9/2014 |
| CN | 104299561 | A | 1/2015 |
| CN | 104319283 | A | 1/2015 |
| CN | 104465714 | A | 3/2015 |
| CN | 104505015 | A | 4/2015 |
| CN | 104680948 | A | 6/2015 |
| CN | 104681582 | A | 6/2015 |
| CN | 104835832 | A | 8/2015 |
| CN | 103311266 | B | 10/2015 |
| CN | 105044954 | A | 11/2015 |
| CN | 105137641 | A | 12/2015 |
| CN | 105139764 | A | 12/2015 |
| CN | 105225612 | A | 1/2016 |
| CN | 105448951 | A | 3/2016 |
| CN | 105552099 | A | 5/2016 |
| CN | 106023819 | A | 10/2016 |
| CN | 206322697 | U | 7/2017 |
| CN | 108010934 | A | 5/2018 |
| CN | 108091667 | A | 5/2018 |
| JP | H0375688 | A | 3/1991 |
| JP | H03-233593 | A | 10/1991 |
| JP | H0772826 | A | 3/1995 |
| JP | 2000502813 | A | 3/2000 |
| JP | 2004252273 | A | 9/2004 |
| JP | 2008197228 | A | 8/2008 |
| JP | 2010165587 | A | 7/2010 |
| KR | 20120010302 | A | 2/2012 |
| TW | 201428956 | A | 7/2014 |
| TW | 201626063 | A | 7/2016 |
| WO | 2016086509 | A1 | 6/2016 |

OTHER PUBLICATIONS

Japanese Office Action dated Mar. 23, 2021, in connection with corresponding JP Application No. 2019-563815 (8 pp., including machine-generated English translation).
International Search Report dated Nov. 1, 2018 in corresponding International application No. PCT/CN2018/098354; 8 pages including Partial English-language translation.
Chinese Office Action dated Dec. 13, 2018, in connection with corresponding CN Application No. 201810774606.4; 9 pages including Partial English-language translation.
Chinese Office Action dated Sep. 2, 2020, in connection with corresponding CN Application No. 201710775349.6 (5 pp., including machine-generated English translation).
Extended European Search Report dated Aug. 5, 2020, including the Supplementary European Search Report and the European Search Opinion, in connection with corresponding EP Application No. 18849577.4 (9 pp.).
Japanese Office Action dated Nov. 10, 2020, in connection with corresponding JP Application No. 2019-563815 (8 pp., including machine-generated English translation).
Office Action dated Jul. 9, 2019 in corresponding Taiwanese Application No. 10820650910; 11 pages including an English-language translation of the Search Report.
Office Action dated Oct. 8, 2019, in corresponding Chinese Application No. 201710775349.6; 18 pages.

* cited by examiner

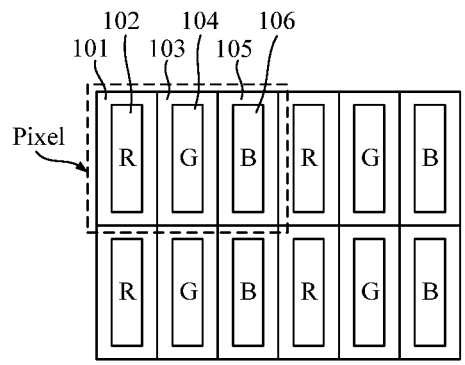 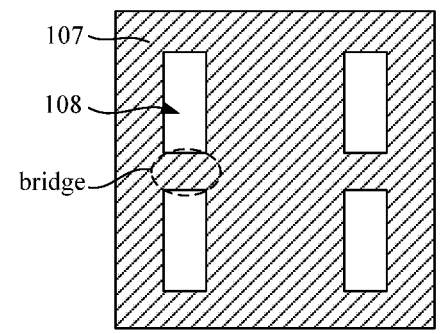
Fig. 1a    Fig. 1b
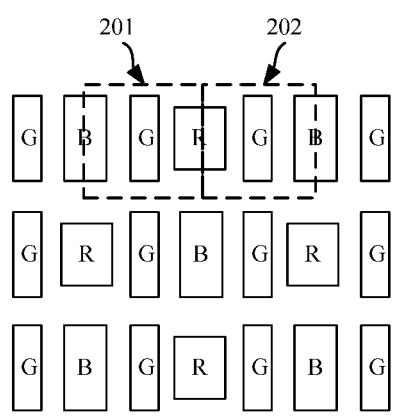 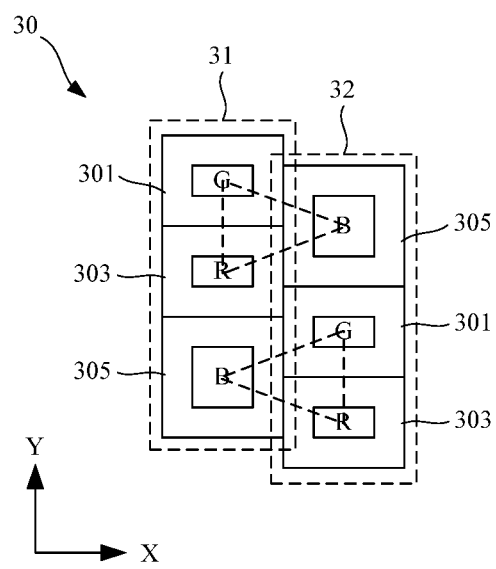
Fig. 2    Fig. 4

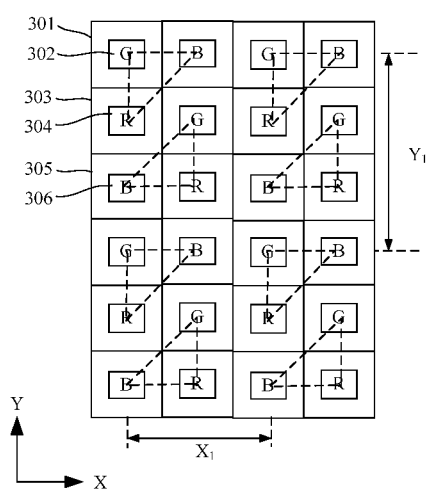
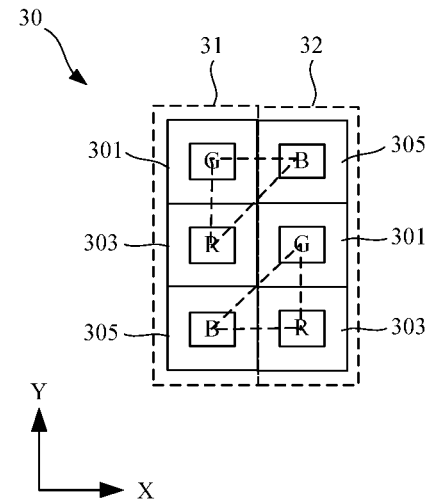
Fig. 13　　　　　　　　　　Fig. 14
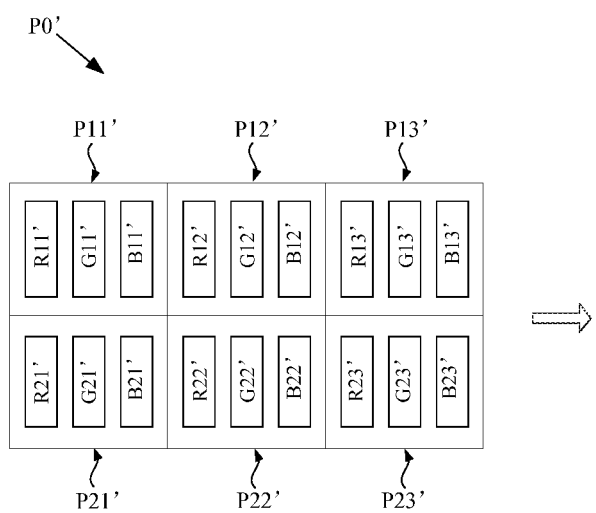
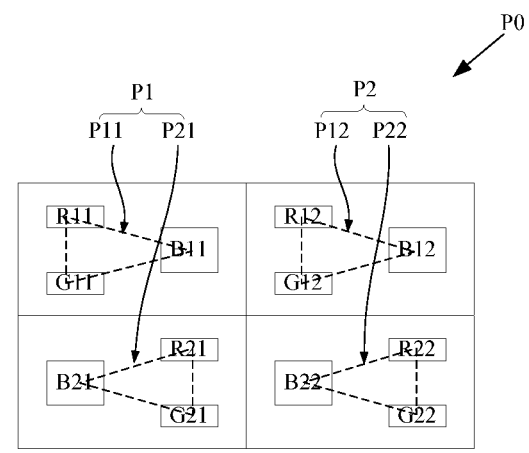
(a)　　　　　　　　　　(b)
Fig. 15

PIXEL STRUCTURE, OLED DISPLAY DEVICE AND DRIVING METHOD

TECHNICAL FIELD

The present disclosure relates to the field of display technologies, and particularly, to a pixel structure, an OLED display device including the pixel structure and a driving method for the pixel structure.

BACKGROUND

Organic Light-Emitting Diode (OLED) is an active light-emitting device. Compared with the conventional Liquid Crystal Display (LCD), an OLED display technology requires no backlight and has self-illuminating properties. The OLED uses a relatively thin organic material film layer and a glass substrate. When a current passes, the organic material emits light. Therefore, OLED display screen can significantly save electric energy, can be fabricated lighter and thinner, withstand a wider range of temperature variations than LCD display screen, as well as have a larger viewing angle. The OLED is expected to become the next generation flat panel display technology after the LCD, and is one of the most popular technologies in flat panel display technologies.

There are many types of colorization methods for OLED panels. Currently, an OLED colorization technology that is relatively mature and has been successfully mass-produced is mainly an OLED evaporation technology. The OLED evaporation technology adopts conventional RGB stripe arrangement for evaporation, in which a side-by-side arrangement leads to a best picture effect. In the side-by-side arrangement, there are three sub-pixels of red, green, and blue (R, G, and B) in a pixel range. Each sub-pixel is in a quadrangular shape, and has its own independent organic light-emitting device. The organic light-emitting device is formed at a corresponding pixel position on an array substrate through a Fine Metal Mask (FMM) by using an evaporation film forming technology. The FMM is often briefly referred to as a metal mask or an evaporation mask. A technology for producing an OLED display screen with a high PPI (Pixel Per Inch, the number of pixels per inch) mainly focuses on a fine and mechanically stable FMM and pixel (sub-pixel) arrangement.

FIG. 1a is a schematic diagram of an arrangement of pixels of an OLED display device. As shown in FIG. 1a, the OLED display device uses a side-by-side arrangement for pixels, and each pixel includes an R sub-pixel region 101, a G sub-pixel region 103, and a B sub-pixel region 105. Wherein the R sub-pixel region 101 includes an R light-emitting region 102 and an R non-light-emitting region (not numbered). The G sub-pixel region 103 includes a G light-emitting region 104 and a G non-light-emitting region (not numbered). The B sub-pixel region 105 includes a B light-emitting region 106 and a B non-light-emitting region (not numbered). As shown in FIG. 1a, an area of each of the sub-pixels of R, G, and B is the same and an area of each of the R, G, and B light-emitting regions is the same. The sub-pixels of R, G, and B are arranged along a straight line. In the industry, this type of pixel structure is generally referred to as a Real pixel structure (Real RGB). Specifically, a light-emitting region of each sub-pixel region includes a cathode, an anode, and an electroluminescent layer, wherein the electroluminescent layer is located between the cathode and the anode, and is configured to generate a light of a predetermined color to implement display. During fabrication of the display screen, an evaporation process is generally required to form an electroluminescent layer of a corresponding color (red, green, or blue) in a light-emitting region of a pixel region of the corresponding color.

An FMM shown in FIG. 1b is generally used to perform evaporation on the OLED display shown in FIG. 1a. This type of FMM includes a blocking region 107 and several evaporation openings 108. A block region between adjacent two evaporation openings 108 in a same column is referred to as a bridge. To avoid a shielding effect on a sub-pixel during evaporation, a sufficient distance between the sub-pixel and a bridge needs to be maintained, causing a decrease in a length of the sub-pixel in an up-and-down direction, thus affecting an opening ratio of each sub-pixel. In a conventional side-by-side arrangement for RGB pixels, only 200-300 PPI can be reached, which is difficult to achieve a high-resolution display effect. With the increasing demand of users for the resolution of OLED display devices, such a side-by-side arrangement for RGB pixels can no longer meet design requirements of high PPI products.

FIG. 2 is a schematic diagram of an arrangement of pixels of another OLED display device. As shown in FIG. 2, in each pixel, only a G sub-pixel is used individually, and each of sub-pixels of R and B is shared by adjacent pixels. For example, a pixel 201 and a pixel 202 share an R sub-pixel. This arrangement may increase display PPI. However, in this arrangement, each of the sub-pixels of R and B is shared by the adjacent pixels, and a distortion may exist in an entire display effect, so that this is not a full color display in a true sense.

SUMMARY OF THE INVENTION

An objective of the present disclosure is to provide a pixel structure, an OLED display device including the pixel structure and a driving method for the pixel structure, to resolve the problem existing in the prior art.

To resolve the foregoing technical problem, the present disclosure provides a pixel structure, including a plurality of pixel units arranged in a matrix form, each of the pixel units including two pixel subunits that are adjacently arranged along a first direction, each pixel subunit comprising three sub-pixels having different colors, wherein in each of the pixel units, one of the pixel subunits includes a first sub-pixel, a second sub-pixel, and a third sub-pixel, or a second sub-pixel, a first sub-pixel, and a third sub-pixel that are sequentially arranged along a second direction, and the other one of the pixel subunits includes a third sub-pixel, a first sub-pixel, and a second sub-pixel or a third sub-pixel, a second sub-pixel, and a first sub-pixel that are sequentially arranged along the second direction. Because the third sub-pixels in the two pixel subunits in each pixel unit are arranged in a mutually staggered manner, when process conditions are the same, using such a structure in which sub-pixels in adjacent rows are arranged in a staggered manner increases a distance that can be used between openings of same sub-pixels, and can reduce a difficulty of a mask manufacturing process and an evaporation process, so that a pixel can be manufactured in a smaller size, thereby manufacturing of high-resolution displays may be achieved.

In the pixel structure, two pixel subunits in each of the pixel units constitute two pixels adjacently arranged along the second direction, and a distance between centers of any sub-pixels having a same color in the second direction is 2 or 2N/(N+1) times of a distance between centers of any sub-pixels that have the same color in the first direction; or the two pixel subunits constitute two pixels adjacently arranged along the first direction, and a distance between centers of any sub-pixels having a same color in the first direction is 2N/(N+1) times of a distance between centers of any sub-pixels that have the same color in the second direction. In this way, pixels in the pixel structure in a direction are configured to be equivalent to (N+1)/N times of pixels in a Real pixel structure, thereby a virtual resolution of a display device is increased.

To resolve the foregoing technical problem, the present disclosure further provides an OLED display device, including the pixel structure described above.

To resolve the foregoing technical problem, the present disclosure further provides a driving method for the pixel structure described above, where N has a value of 2, the driving method including: configuring pixels in the pixel structure in one of the directions to be equivalent to 3/2 times of pixels in a Real pixel structure, obtaining corresponding relationships between sub-pixels in the pixel structure and sub-pixels in the Real pixel structure as well as luminance values of the sub-pixels in the Real pixel structure, and determining luminance values of each of the sub-pixels in the pixel structure according to the luminance values of each of the sub-pixels in the Real pixel structure and the corresponding relationships.

BRIEF DESCRIPTION OF THE DRAWINGS

FIG. 1a is a schematic diagram of an arrangement of pixels of an OLED display device in the prior art;

FIG. 1b is a schematic diagram of an FMM corresponding to FIG. 1a;

FIG. 2 is a schematic diagram of an arrangement of pixels of another OLED display device in the prior art;

FIG. 4 is a schematic diagram of a pixel unit in FIG. 3;

FIG. 13 is a schematic diagram of an arrangement of pixels of another OLED display device according to an embodiment of the present disclosure;

FIG. 14 is a schematic diagram of a pixel unit in FIG. 13;

FIG. 15 is a schematic equivalent diagram according to an embodiment of the present disclosure;

DETAILED DESCRIPTION

Figure 3:
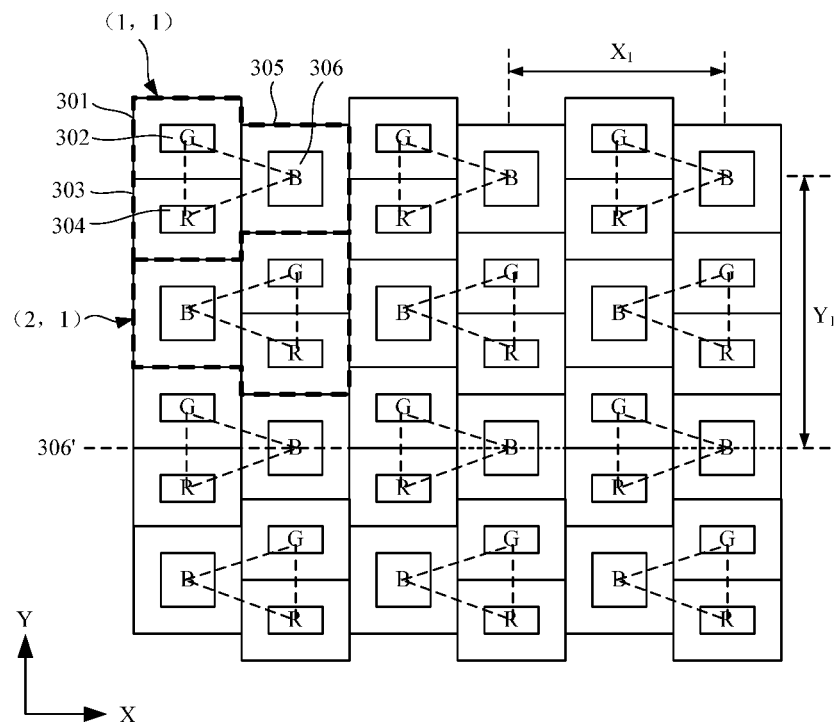
FIG. 3 is a schematic diagram of an arrangement of pixels of an OLED display device according to an embodiment of the present disclosure.

The inventor of this disclosure found, through a research, that a conventional arrangement for RGB pixels can no longer meet requirements on both an opening ratio and a display effect of a product. Therefore, a pixel structure of an OLED display device is provided. The pixel structure includes a plurality of pixel units arranged in a matrix form. Each of the pixel units includes two pixel subunits that are adjacently arranged along a first direction and each of the pixel subunits includes three sub-pixels having different colors. One pixel subunit includes a first sub-pixel, a second sub-pixel, and a third sub-pixel or a second sub-pixel, a first sub-pixel, and a third sub-pixel that are sequentially arranged along a second direction, and the other pixel subunit includes a third sub-pixel, a first sub-pixel, and a second sub-pixel or a third sub-pixel, a second sub-pixel, and a first sub-pixel that are sequentially arranged along the second direction.

The two pixel subunits constitute two pixels adjacently arranged along the second direction. Therefore, each pixel includes a first sub-pixel, a second sub-pixel, and a third sub-pixel that have different colors. Virtual connection lines of centers of the three sub-pixels comprise a triangular shape. Or, the two pixel subunits constitute two pixels adjacently arranged along the first direction. Therefore, each pixel includes a first sub-pixel, a second sub-pixel, and a third sub-pixel that have different colors. Each of the two pixels has a rectangular shape.

In the pixel structure, third sub-pixels in two pixel subunits of each pixel unit are arranged in a mutually staggered manner. When process conditions are the same, using such a structure in which sub-pixels are arranged in a staggered manner increases a distance that can be used between openings of same sub-pixels, and can reduce difficulty of a mask manufacturing process and an evaporation process, so that a pixel can be manufactured in a smaller size, thereby facilitating manufacturing of high-resolution displays. In addition, each pixel in the pixel structure includes three colors (three colors of R, G, and B), which may achieve a full color display in a true sense. Moreover, in the pixel structure, sub-pixels comprising three colors are arranged in a column (row), and sub-pixels comprising two colors are arranged in a row (column) Compared with distributing sub-pixels comprising only one color in a direction, in this arrangement, display is relatively uniform in a row direction and in a column direction.

The two pixel subunits in each pixel unit are, for example, a first pixel subunit and a second pixel subunit. When the first pixel subunit and the second pixel subunit constitute two pixels adjacently arranged along the second direction, virtual connection lines of centers of a first sub-pixel, a second sub-pixel, and a third sub-pixel in each pixel comprise, for example, in accordance with the following manner, a triangular shape:

(1) The first direction is a row direction, the second direction is a column direction, and correspondingly, a first sub-pixel and a second sub-pixel in each pixel are arranged in the first column, and a third sub-pixel is arranged in the second column adjacent to the first column. Specifically, the first column is an odd-numbered column ($1^{st}$, $3^{rd}$, $5^{th}$, . . . column), and correspondingly, the second column is an even-numbered column ($2^{nd}$, $4^{th}$, $6^{th}$, . . . column) Alternatively, the first column is an even-numbered column, and correspondingly, the second column is an odd-numbered column. Herein, it is not specifically limited thereto.

(2) The first direction is a column direction, the second direction is a row direction, and correspondingly, a first sub-pixel and a second sub-pixel in each pixel are arranged in the first row, and a third sub-pixel is arranged in the second row adjacent to the first row. Specifically, the first row is an odd-numbered row (1st, 3rd, 5th, . . . row), and correspondingly, the second row is an even-numbered row (2nd, 4th, 6th, . . . row). Alternatively, the first row is an even-numbered row, and correspondingly, the second row is an odd-numbered row. Herein, it is not specifically limited thereto.

When the two pixel subunits constitute two pixels adjacently arranged along the second direction, in the pixel structure, a distance $Y_1$ between centers of any sub-pixels having a same color in the second direction (such as a column direction) and a distance $X_1$ between centers of any sub-pixels having a same color in the first direction (such as a row direction) may have the following relationship:

(1) Each pixel unit includes two pixels in the column direction, and M pixels in the row direction in the pixel structure are enabled to achieve a display effect of M*(N+1)/N pixels in the Real pixel structure so that a virtual resolution is increased. Therefore, $$Y_1/2=N/(N+1)X_1.$$

That is, $Y_1=2N/(N+1)X_1$, where

N is an integer greater than or equal to 1.

In other words, the distance $Y_1$ between the centers of the any sub-pixels having the same color in the second direction is 2N/(N+1) times of the distance $X_1$ between the centers of the any sub-pixels having the same color in the first direction.

(2) Each pixel unit includes two pixels in the column direction, and M pixels in the row direction in the pixel structure are enabled to achieve a display effect (no compression is needed) of M pixels in the Real pixel structure. Therefore, $$Y_1/2=X_1.$$

That is, $Y_1=2X_1$.

In other words, the distance $Y_1$ between the centers of the any sub-pixels having the same color in the second direction is twice the distance $X_1$ between the centers of the any sub-pixels having the same color in the first direction.

The two pixel subunits in each pixel unit are, for example, a first pixel subunit and a second pixel subunit. When the first pixel subunit and the second pixel subunit constitute two pixels adjacently arranged along the first direction, virtual connection lines of centers of a first sub-pixel, a second sub-pixel, and a third sub-pixel in each pixel comprise, for example, in accordance with the following manner, a rectangular shape:

(1) The first direction is a row direction, the second direction is a column direction, and correspondingly, a first sub-pixel, a second sub-pixel, and a third sub-pixel in the first pixel are arranged in the first column, and a first sub-pixel, a second sub-pixel, and a third sub-pixel in the second pixel are arranged in the second column. Specifically, the first column is an odd-numbered column ($1^{st}$, $3^{rd}$, $5^{th}$, . . . column), and correspondingly, the second column is an even-numbered column ($2^{nd}$, $4^{th}$, $6^{th}$, . . . column). Alternatively, the first column is an even-numbered column, and correspondingly, the second column is an odd-numbered column. Herein, it is not specifically limited thereto.

(2) The first direction is a column direction, the second direction is a row direction, and correspondingly, a first sub-pixel, a second sub-pixel, and a third sub-pixel in the first pixel are arranged in the first row, and a first sub-pixel, a second sub-pixel, and a third sub-pixel in the second pixel are arranged in the second row. Specifically, the first row is an odd-numbered row (1st, 3rd, 5th, . . . row), and correspondingly, the second row is an even-numbered row (2nd, 4th, 6th, . . . row). Alternatively, the first row is an even-numbered row and correspondingly, the second row is an odd-numbered row. Herein, it is not specifically limited thereto.

When the two pixel subunits constitute two pixels adjacently arranged along the second direction, in the pixel structure, a distance $Y_1$ between centers of any sub-pixels having a same color in the second direction (such as a column direction) and a distance $X_1$ between those in the first direction (such as a row direction) may have the following relationship:

Each pixel unit allocates two pixels to the row direction, and M pixels in the column direction are enabled to achieve a display effect of M*(N+1)/N pixels in the Real pixel structure. Therefore, $$X_1/2=N/(N+1)Y_1.$$

That is, $X_1=2N/(N+1)Y_1$, where

N is an integer greater than or equal to 1.

In other words, the distance $X_1$ between the centers of the any sub-pixels having the same color in the first direction is 2N/(N+1) times of the distance $Y_1$ between those in the second direction.

The following describes in detail the pixel structure and the driving method therefor in the present disclosure with reference to the accompanying drawings.

FIG. 3 is a schematic diagram of an arrangement of pixels of an OLED display device according to an embodiment of the present disclosure, and FIG. 4 is a schematic diagram of a pixel unit in FIG. 3. The first direction (an X direction) is a row direction (a traverse direction), and the second direction (a Y direction) is a column direction (a longitudinal direction). For simplicity, in the accompanying drawings, only a part of the OLED display device is shown, a quantity of the pixels of an actual product is not limited thereto, and a quantity of the pixels may be correspondingly changed according to an actual display requirement. In the present disclosure, each of the first row, the second row, the first column, the second column, . . . is used to describe the present disclosure by using those shown in the figure as a reference criterion, and are not intended to refer to rows and columns in an actual product.

As shown in FIG. 3 and FIG. 4, the pixel structure includes a plurality of pixel units 30 arranged in a matrix form, each of the pixel units 30 includes a first pixel subunit 31 and a second pixel subunit 32 that are adjacently arranged along the first direction (which refers to the X direction herein) and each includes three sub-pixels having different colors. The first pixel subunit 31 includes a first sub-pixel 301, a second sub-pixel 303, and a third sub-pixel 305 that are sequentially arranged along the second direction (which refers to the Y direction herein). The second pixel subunit 32 includes a third sub-pixel 305, a first sub-pixel 301, and a second sub-pixel 303 that are sequentially arranged along the second direction. A first pixel subunit 31 and a second pixel subunit 32 in each pixel unit 30 constitute two pixels adjacently arranged along the second direction, as shown by a pixel (1, 1) and a pixel (2, 1) in FIG. 3. In other words, each pixel unit includes two pixels. Therefore, each pixel includes a first sub-pixel 301, a second sub-pixel 303, and a third sub-pixel 305 that have different colors and virtual connection lines of centers of these three sub-pixels comprise a triangular shape (as shown by a triangular dashed line box in FIG. 4), and each pixel includes three colors of R, G, and B, to achieve a full color display in a true sense.

Preferably, all pixels in a same row have a same arrangement structure, and an arrangement structure of each pixel after being flipped 180 degrees (which flips in a left-right direction by itself) along the row direction is the same as an arrangement structure of an adjacent pixel in a same column. In this way, pixels may be more compactly arranged, reducing pixel pitches, and increasing PPI.

Herein, a pixel in the first row and the first column is denoted as a pixel (1, 1), a pixel in the first row and the second column is denoted as a pixel (1, 2), a pixel in the second row and the first column is denoted as a pixel (2, 1), a pixel in the second row and the second column is denoted as a pixel (2, 2), and so on. As shown in FIG. 3, an arrangement structure of the pixel (1, 1) in the first row and the first column after being flipped 180 degrees along the X direction is the same as an arrangement structure of an adjacent pixel in the Y direction, that is, the pixel (2, 1) in the second row and the first column. In this way, two pixels in a same pixel unit 30, for example, third sub-pixels 305 of the pixel (1, 1) and the pixel (2, 1), are arranged in a mutually staggered manner (the third sub-pixels in the pixel (1, 1) and the pixel (2, 1) are not arranged on one straight line). Therefore, evaporation openings of an evaporation mask (FMM) used for forming the third sub-pixel are also arranged in a staggered manner, to reduce a difficulty of an evaporation mask manufacturing process and an evaporation process. Compared with a case in which sub-pixels in pixels in two adjacent rows in the Real pixel structure are arranged in an alignment manner, when process conditions are the same, use of such a structure in which sub-pixels in adjacent rows are arranged in a staggered manner increases a distance that can be used between openings of same sub-pixels, so that a pixel can be manufactured in a smaller size, thereby facilitating manufacturing of high-resolution displays.

The first sub-pixel 301, the second sub-pixel 303, and the third sub-pixel 305 may have an arrangement comprising a triangular shape, an inverted triangular shape, a triangular shape rotated leftward by 90 degrees, or a triangular shape rotated rightward by 90 degrees, or may substantially have an arrangement comprising a triangular shape, an inverted triangular shape, a triangular shape rotated leftward by 90 degrees, or a triangular shape rotated rightward by 90 degrees. In an arrangement structure shown in FIG. 3, in a pixel that is in an odd-numbered row, a first sub-pixel 301, a second sub-pixel 303, and a third sub-pixel 305 have an arrangement comprising a triangular shape rotated rightward by 90 degrees. That is, the first sub-pixel 301 and the second sub-pixel 303 are arranged on a left side, and the third sub-pixel 305 is arranged on a right side. In a pixel that is in an even-numbered row, a first sub-pixel 301, a second sub-pixel 303, and a third sub-pixel 305 have an arrangement comprising a triangular shape rotated leftward by 90 degrees. That is, the third sub-pixel 305 is arranged on a left side, and the first sub-pixel 301 and the second sub-pixel 303 are arranged on a right side.

Further, the first sub-pixels 301 in all pixels in a same row are arranged on one straight line. The second sub-pixels 303 in all pixels in a same row are arranged on one straight line. And the third sub-pixels 305 in all pixels in a same row are also arranged on one straight line.

Each sub-pixel in a pixel includes a light-emitting region (a display region) and a non-light-emitting region (a non-display region). A light-emitting region in each sub-pixel includes a cathode, an anode, and an electroluminescent layer (an organic emissive layer). The electroluminescent layer is located between the cathode and the anode, and is configured to generate a light of a predetermined color to implement display. Three evaporation processes are generally required to be used to respectively form an electroluminescent layer of a corresponding color (for example, red, green, or blue) in a light-emitting region of a pixel region of the corresponding color. Certainly, if shapes and arrangements are respectively the same, a same mask may be used in a deviation manner or another manner to implement evaporation of electroluminescent layers of a plurality of colors.

The first sub-pixel, the second sub-pixel, and the third sub-pixel include a red (R) sub-pixel, a green (G) sub-pixel, and a blue (B) sub-pixel. To be specific, in this embodiment, the first sub-pixel is one of a red (R) sub-pixel, a green (G) sub-pixel, and a blue (B) sub-pixel, the second sub-pixel is one of a red (R) sub-pixel, a green (G) sub-pixel, and a blue (B) sub-pixel, the third sub-pixel is one of a red (R) sub-pixel, a green (G) sub-pixel, and a blue (B) sub-pixel. Colors of the first sub-pixel, the second sub-pixel, and the third sub-pixel are all different. For example, in the arrangement structure as shown in FIG. 3, the first sub-pixel 301 is a green (G) sub-pixel, the second sub-pixel 303 is a red (R) sub-pixel, and the third sub-pixel 305 is a blue (B) sub-pixel. Correspondingly, the first sub-pixel 301 includes a G light-emitting region 302 and a G non-light-emitting region, and includes an organic emission layer configured to emit green light. The second sub-pixel 303 includes an R light-emitting region 304 and an R non-light-emitting region, and includes an organic emission layer configured to emit red light. The third sub-pixel 305 includes a B light-emitting region 306 and a B non-light-emitting region, and includes an organic emission layer configured to emit blue light.

Preferably, to prolong an OLED lifetime, in a same pixel, an area of a blue sub-pixel is larger than an area of a red sub-pixel and an area of a green sub-pixel. This is because a blue light-emitting material used for manufacturing the blue sub-pixel has the shortest lifetime generally. Therefore, a lifetime of an organic electrochromic light-emitting display device mainly depends on a lifetime of the blue sub-pixel. Under same display luminance, when a size of the blue sub-pixel is increased, luminance of the blue sub-pixel may be decreased, and a current density flowing through the blue sub-pixel is reduced so that the lifetime of the blue sub-pixel is prolonged and hence the lifetime of the organic electroluminescence display device is prolonged.

In FIG. 3, the first sub-pixel 301 and the second sub-pixel 303 are preferably equal in shape and area, and are distributed in a mirror symmetry manner. In each pixel, a central line of a third sub-pixel 305 extending along the row direction overlaps a boundary line between the first sub-pixel 301 and the second sub-pixel 303. This is beneficial to reduce pixel pitches and make RGB sub-pixels distributed uniformly, having a relatively good display effect. Specifically, referring to FIG. 3, a central line 306' of a third sub-pixel 305 extending along the row direction (the central line 306' equally divides the third sub-pixel 305 into two parts and the central line 306' extends along the row direction) overlaps a boundary line between a first sub-pixel 301 and a second sub-pixel 303. It should be noted that, because the first sub-pixel 301 and the second sub-pixel 303 in a same pixel share one edge, the shared edge is a boundary line between the first sub-pixel 301 and the second sub-pixel 303. However, it should be understood that, a "boundary" or the "boundary line" herein is not limited to a physical "boundary" or "boundary line", and may refer to a virtual "boundary" or "boundary line" between two pixels or sub-pixels. In FIG. 3, a shape of each of the first sub-pixel 301 and the second sub-pixel 303 is a rectangular shape, a shape of the third sub-pixel 305 is a square shape, and the first sub-pixel 301 and the second sub-pixel 303 are arranged along a direction in which short edges thereof extend. A light-emitting region 306 of the third sub-pixel 305 has an edge length (a height) that is twice a length of a short edge of a light-emitting region 302 of the first sub-pixel 301 and a length of a short edge of a light-emitting region 304 of the second sub-pixel 303.

Figure 5:
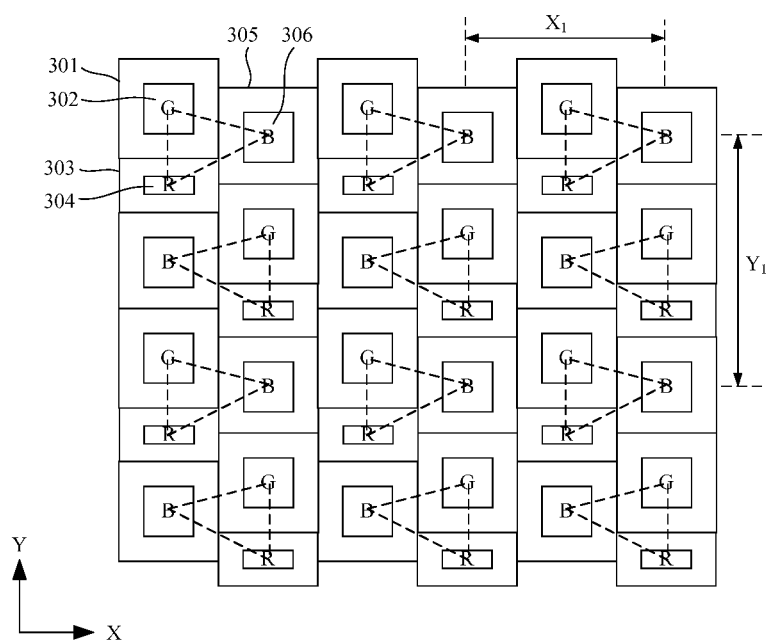
FIG. 5 is a schematic diagram of an arrangement of pixels of another OLED display device according to an embodiment of the present disclosure.

However, it should be understood that the shape of each of the first sub-pixel 301, the second sub-pixel 303, and the third sub-pixel 305 is not limited to a rectangular shape, and may further be another quadrangular shape other than the rectangular shape, or may be one or any combination of polygonal shapes such as a triangular shape, a pentagonal shape, a hexagonal shape, and an octagonal shape. During actual application, some changes may be further partially performed based on the foregoing shapes, for example, four corners of a quadrangular shape are made to be round corners, to present particular arcs. In addition, the first sub-pixel 301 and the second sub-pixel 303 may not be equal in area. An area of the third sub-pixel 305 is not limited to being twice an area of the first sub-pixel 301 or an area of the second sub-pixel 303. Each sub-pixel may be correspondingly adjusted in the shape and/or the area according to a color matching requirement. For example, areas of the first sub-pixel 301, the second sub-pixel 303, and the third sub-pixel 305 may be different from one another. The area of the third sub-pixel 305 (the blue sub-pixel) is larger than an area of the first sub-pixel 301 (the green sub-pixel). The area of the first sub-pixel 301 (the green sub-pixel) is larger than the area of the second sub-pixel 303 (the red sub-pixel). Alternatively, as shown in FIG. 5, the area of the third sub-pixel 305 (the blue sub-pixel) is equal to the area of the first sub-pixel 301 (the green sub-pixel). The area of each of the third sub-pixel 305 (the blue sub-pixel) and the area of the first sub-pixel 301 (the green sub-pixel) is larger than the area of the second sub-pixel 303 (the red sub-pixel), that is, the second sub-pixel 303 (the red sub-pixel) has the smallest area.

In the pixel structure, a distance $Y_1$ between centers of any sub-pixels having a same color in the second direction (the Y direction or the column direction) and a distance $X_1$ between those in the first direction (the X direction or the row direction) may have the following relationship: $Y_1=2N/(N+1)X_1$, $Y_1=2X_1$, or $X_1/2=N/(N+1)Y_1$, where N is an integer greater than or equal to 1.

For example, referring to FIG. 3, a distance $Y_1$ between centers of the third sub-pixels 305 (the blue sub-pixel) in the second direction (the Y direction or the column direction) is 4/3 times of a distance $X_1$ between the third sub-pixels 305 in the first direction (the X direction or the row direction).

Figure 6:
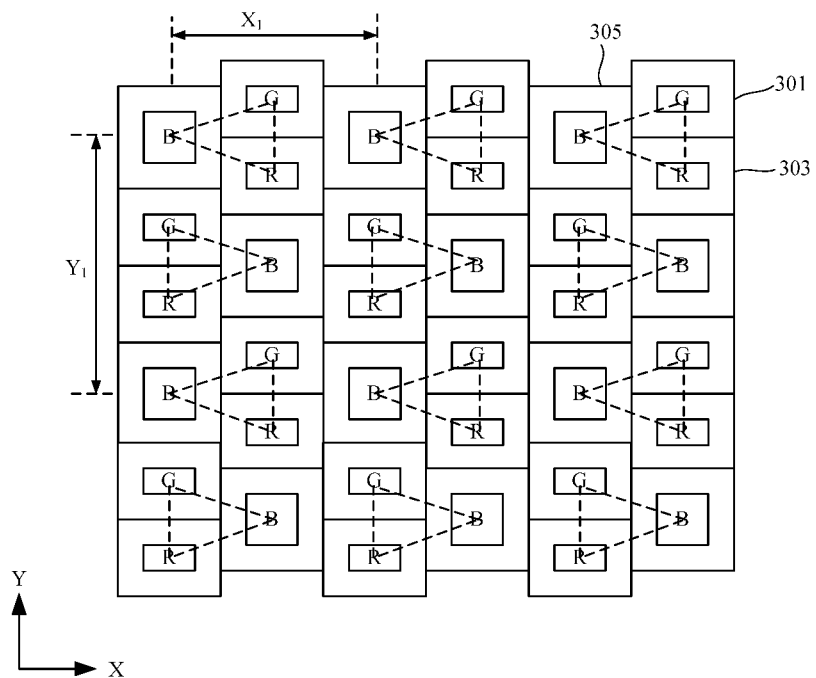
FIG. 6 is a schematic diagram of an arrangement of pixels of another OLED display device according to an embodiment of the present disclosure.
Figure 7:
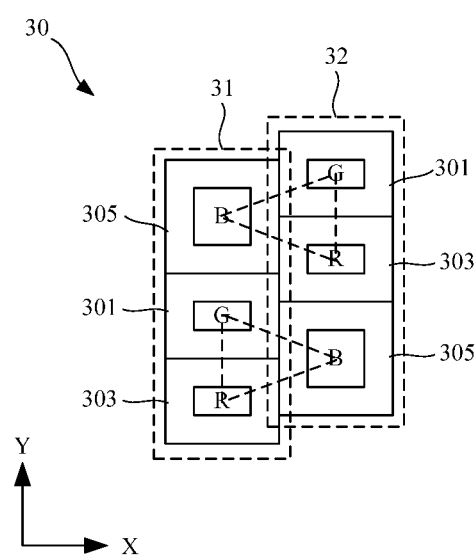
FIG. 7 is a schematic diagram of a pixel unit in FIG. 6.

FIG. 6 is a schematic diagram of an arrangement of pixels of another OLED display device according to an embodiment of the present disclosure, and FIG. 7 is a schematic diagram of a pixel unit in FIG. 6. A difference between the pixel structure and the pixel structure shown in FIG. 3 is that the pixel structure is obtained by horizontally flipping the entire pixel structure shown in FIG. 3 by 180 degrees. The first pixel subunit 31 includes a third sub-pixel 305, a first sub-pixel 301, and a second sub-pixel 303 that are sequentially arranged along the second direction (which refers to a Y direction herein). The second pixel subunit 32 includes a first sub-pixel 301, a second sub-pixel 303, and a third sub-pixel 305 that are sequentially arranged along the second direction. Specifically, in a pixel that is in an odd-numbered row, a first sub-pixel 301, a second sub-pixel 303, and a third sub-pixel 305 have an arrangement comprising a triangular shape rotated leftward by 90 degrees, that is, the third sub-pixel 305 is arranged on a left side, and the first sub-pixel 301 and the second sub-pixel 303 are arranged on a right side. In a pixel that is in an even-numbered row, a first sub-pixel 301, a second sub-pixel 303, and a third sub-pixel 305 have an arrangement comprising a triangular shape rotated rightward by 90 degrees, that is, the first sub-pixel 301 and the second sub-pixel 303 are arranged on a left side, and the third sub-pixel 305 is arranged on a right side.

Figure 8:
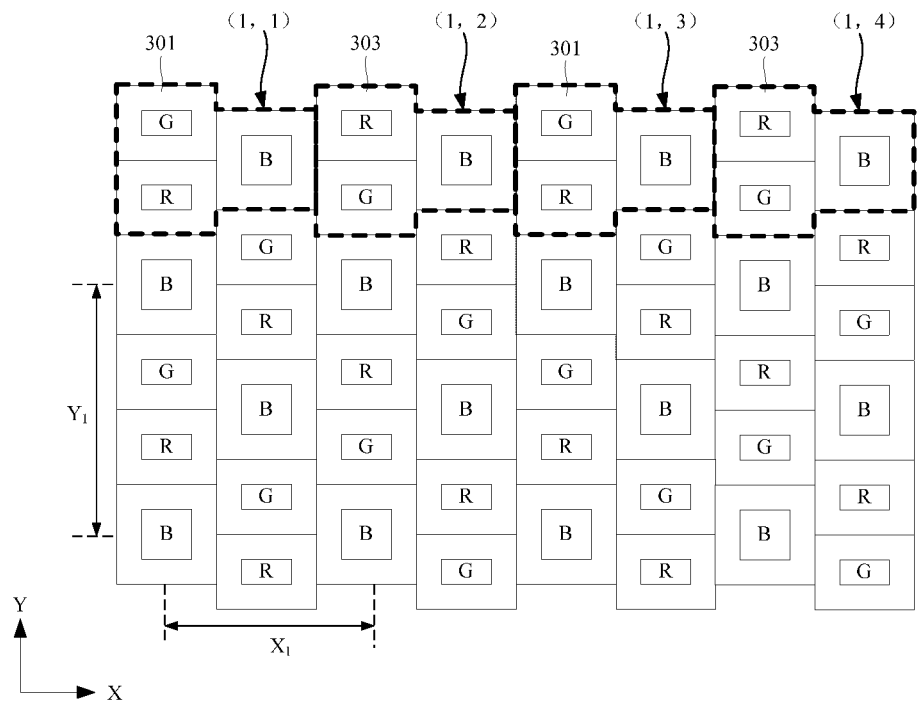
FIG. 8 is a schematic diagram of an arrangement of pixels of another OLED display device according to an embodiment of the present disclosure.

FIG. 8 is a schematic diagram of an arrangement of pixels of another OLED display device according to an embodiment of the present disclosure. A difference between the pixel structure and the pixel structure shown in FIG. 3 is that first sub-pixels 301 and second sub-pixels 303 in all pixels in a same row are arranged in a staggered manner. Specifically, the first sub-pixels 301 in all the pixels in the same row are not linearly arranged on a straight line. The second sub-pixels 303 in all the pixel in the same row are also not arranged on a straight line. Instead, the first sub-pixels 301 and the second sub-pixels 303 in all the pixels in the same row are arranged on one straight line in a staggered manner. For example, a first sub-pixel 301 in a pixel (1, 1) in the first row and the first column, a second sub-pixel 303 in a pixel (1, 2) in the first row and the second column, a first sub-pixel 301 in a pixel (1, 3) in the first row and the third column, . . . are sequentially arranged on one straight line.

Figure 9:
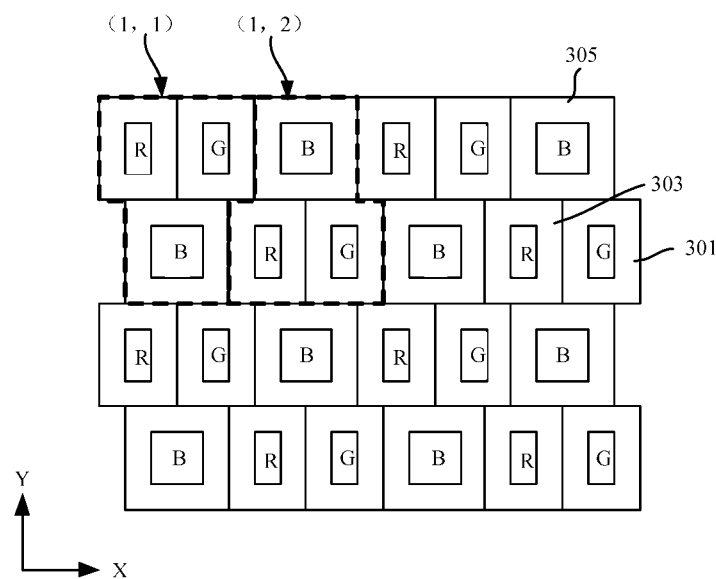
FIG. 9 is a schematic diagram of an arrangement of pixels of another OLED display device according to an embodiment of the present disclosure.

FIG. 9 is a schematic diagram of an arrangement of pixels of another OLED display device according to an embodiment of the present disclosure. A difference between the pixel structure and the pixel structure shown in FIG. 3 is that the pixel structure is obtained by rotating the OLED display device shown in FIG. 3 by 90 degrees, so that rows and columns are mutually replaced. If an X direction is still referred to as a row direction (a traverse direction), and a Y direction is referred to as a column direction (a longitudinal direction), in this case, it should be understood that a first sub-pixel 301 and a second sub-pixel 303 in a same pixel are arranged in one row, and a third sub-pixel 305 is arranged in another row. All pixels in a same column have a same arrangement structure. Preferably, an arrangement structure of each pixel after being flipped (which flips in an up-down direction by itself) along the column direction is the same as an arrangement structure of an adjacent pixel in a same row. For example, an arrangement structure of the pixel (1, 1) in the first row and the first column after being flipped 180 degrees along the column direction around the center of the pixel (1, 1) is the same as an arrangement structure of an adjacent pixel in the same row, that is, the pixel (1, 2) in the first row and the second column.

Figure 10:
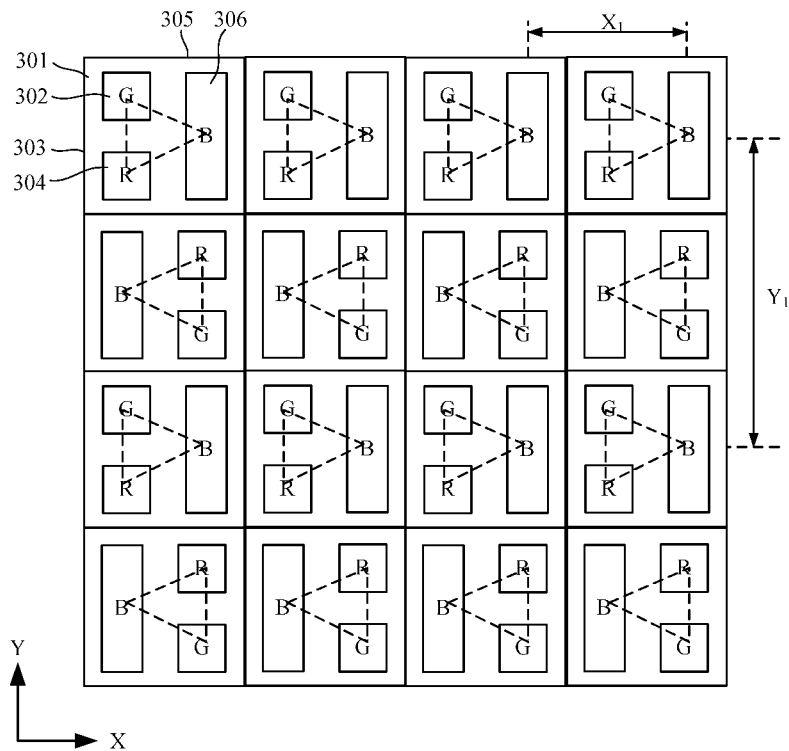
FIG. 10 is a schematic diagram of an arrangement of pixels of another OLED display device according to an embodiment of the present disclosure.

FIG. 10 is a schematic diagram of an arrangement of pixels of another OLED display device according to an embodiment of the present disclosure. A difference between the pixel structure and the pixel structure shown in FIG. 3 is that a distance $Y_1$ between centers of any sub-pixels having a same color in the second direction and a distance $X_1$ between those in the first direction have the following relationship: $Y_1=2X_1$. In this case, no compression algorithm needs to be used, and display may be directly performed by 1:1. A shape of each of a first sub-pixel 301 and a second sub-pixel 303 (and their light-emitting regions) is of a square shape. A shape of a third sub-pixel 305 (and its light-emitting region) is of a rectangular shape. The entirety of a pixel is of a square shape. The first sub-pixel 301 and the second sub-pixel 303 are arranged along an extending direction of a long edge of the third sub-pixel 305.

Figure 11:
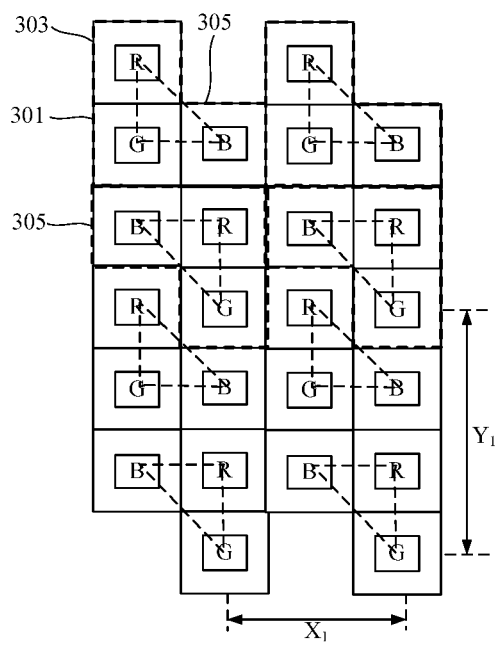
FIG. 11 is a schematic diagram of an arrangement of pixels of another OLED display device according to an embodiment of the present disclosure.
Figure 12:
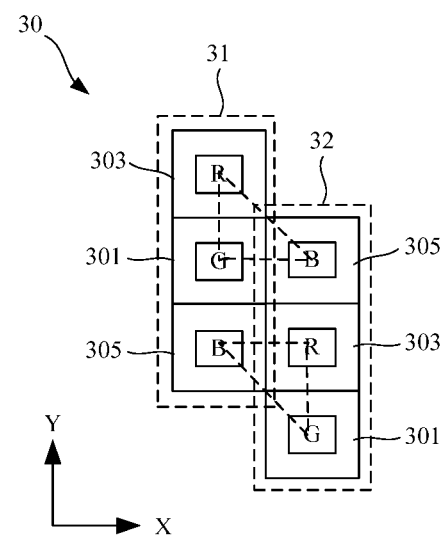
FIG. 12 is a schematic diagram of a pixel unit in FIG. 11.

FIG. 11 is a schematic diagram of an arrangement of pixels of another OLED display device according to an embodiment of the present disclosure, and FIG. 12 is a schematic diagram of a pixel unit in FIG. 11. The pixel structure includes a plurality of pixel units 30 arranged in a matrix form. Each of the pixel units 30 includes a first pixel subunit 31 and a second pixel subunit 32 that are adjacently arranged along the first direction and each of the pixel subunits includes three sub-pixels having different colors. The first pixel subunit 31 includes a second sub-pixel 303, a first sub-pixel 301, and a third sub-pixel 305 that are sequentially arranged along the second direction. The second pixel subunit 32 includes a third sub-pixel 305, a second sub-pixel 303, and a first sub-pixel 301 that are sequentially arranged along the second direction. A first pixel subunit 31 and a second pixel subunit 32 in each pixel unit 30 constitute two pixels adjacently arranged along the second direction. Therefore, each pixel includes a first sub-pixel 301, a second sub-pixel 303, and a third sub-pixel 305 that have different colors and virtual connection lines of centers of these sub-pixels comprise a triangular shape.

As shown in FIG. 11 and FIG. 12, a difference between the pixel structure and the pixel structure shown in FIG. 3 is that in each pixel unit, a central line of a third sub-pixel 305 extending along a row direction in one of the pixel subunits does not overlap a boundary line between a first sub-pixel 301 and a second sub-pixel 303 in the other pixel subunit. For example, a central line of a third sub-pixel 305 of the first pixel subunit 31 extending along a row direction does not overlap a boundary line between a first sub-pixel 301 and a second sub-pixel 303 in the second pixel subunit 32. Instead, the third sub-pixel 305 in the first pixel subunit 31 and the second sub-pixel 303 in the second pixel subunit 32 are arranged in an alignment manner A first pixel subunit 31 and a second pixel subunit 32 in each pixel unit are staggered by a distance of one sub-pixel.

A shape of each of a first sub-pixel 301 (and its light-emitting region), a second sub-pixel 303 (and its light-emitting region), and a third sub-pixel 305 (and its light-emitting region) may be a square shape, and virtual connection lines of centers of the first sub-pixel 301, the second sub-pixel 303, and the third sub-pixel 305 may be an isosceles triangle. That is, in each pixel unit, an entirety of one pixel comprises an L shape, and an entirety of the other pixel comprises an inverted L shape. Preferably, areas of the first sub-pixel 301 (and its light-emitting region), the second sub-pixel 303 (and its light-emitting region), and the third sub-pixel 305 (and its light-emitting region) are the same. In this way, arrangement positions of sub-pixels having a same color present a same regularity, and sizes of various pixels are also the same, that is, arrangement regularities of three sub-pixels having different colors are the same. In this way, a same metal mask can be used when sub-pixels having different colors are manufactured, thereby a quantity of metal masks for manufacturing are reduced.

In the pixel structure, the first sub-pixel 301, the second sub-pixel 303, and the third sub-pixel 305 (three colors of R, G, B) are distributed in the column direction. Two types of sub-pixels (two colors of R and G, or G and B, or B and R) are distributed in the row direction. Compared with distributing sub-pixels of only one color in a direction, in such an arrangement, display is relatively uniform in the row direction and the column direction.

FIG. 13 is a schematic diagram of an arrangement of pixels of another OLED display device according to an embodiment of the present disclosure, and FIG. 14 is a schematic diagram of a pixel unit in FIG. 13. As shown in FIG. 13 and FIG. 14, a difference between the pixel structure and the pixel structure shown in FIG. 11 is that the first pixel subunit 31 includes a first sub-pixel 301, a second sub-pixel 303, and a third sub-pixel 305 that are sequentially arranged along the second direction. The second pixel subunit 32 includes a third sub-pixel 305, a first sub-pixel 301, and a second sub-pixel 303 that are sequentially arranged along the second direction. The third sub-pixel 305 in the first pixel subunit 31 and the second sub-pixel 303 in the second pixel subunit 32 are arranged in an alignment manner, and the third sub-pixel 305 in the second pixel subunit 32 and the first sub-pixel 301 in the first pixel subunit 31 are arranged in an alignment manner. The first pixel subunit 31 and the second pixel subunit 32 in each pixel unit are aligned with each other.

In one pixel, a shape of each of a first sub-pixel 301 (and its light-emitting region), a second sub-pixel 303 (and its light-emitting region), and a third sub-pixel 305 (and its light-emitting region) may be a square shape. Virtual connection lines of centers of the first sub-pixel 301, the second sub-pixel 303, and the third sub-pixel 305 may be an isosceles triangle.

It may be understood that an appropriate deformation may be further performed on the pixel structure, for example, rotating 90 degrees, 180 degrees, or 270 degrees. In addition, appropriate deformations may be performed on a shape and an area of each sub-pixel. For example, positions of the first sub-pixel and the second sub-pixel may be exchanged with each other, and so on. Enumeration is not performed herein.

The foregoing describes several pixel structures of the embodiments of the present disclosure, where a distance $Y_1$ between centers of any sub-pixels having a same color in the second direction (such as a Y direction) and a distance $X_1$ between the centers of the any sub-pixels having the same color in the first direction (such as an X direction) have the following relationship:

$$Y_1=2X_1, \text{ or } Y_1=2N/(N+1)X_1, \text{ where}$$

N is an integer greater than or equal to 1.
For example, when N=2, $Y_1=4/3X_1$.
For example, when N=1, $Y_1=X_1$.

Alternatively, a distance $Y_1$ between centers of any sub-pixels having a same color in the second direction (a Y direction) and a distance $X_1$ between the centers of the any sub-pixels having the same color have the following relationship:

$$X_1/2 = N/(N+1)Y_1,$$

That is, $X_1 = 2N/(N+1)Y_1$, where

N is an integer greater than or equal to 1.

In other words, the distance $X_1$ between the centers of the any sub-pixels having the same color in the first direction is $2N/(N+1)$ times of the distance $Y_1$ between those in the second direction.

Based on the pixel structures provided in the foregoing embodiments, the present disclosure further provides a corresponding pixel structure driving method, to make pixels in a direction in the pixel structure be equivalent to (N+1)/N times of pixels in the Real pixel structure, thereby a virtual resolution of a display device is increased.

For example, when N=2, 2M pixels in a row direction achieves a display effect of 3M pixels in the Real pixel structure. That is, each pixel unit has two pixels in a Y direction, and has one pixel in an X direction, and a resolution in the X direction is compressed to 2/3.

In this case, pitches in the X and Y directions have the following relationship:

$$Y_1/2 = 2/3 X_1.$$

That is, $Y_1 = 4/3 X_1$.

Generally, display information of an image is based on the Real pixel structure. Therefore, before this type of image information is input to the pixel structure in this embodiment for image display, the display information needs to be converted. Pixel luminance in the Real pixel structure is allocated to the pixel structure in this embodiment. In this case, pixels in the Real pixel structure have a one-to-one correspondence with pixels in the pixel structure in this embodiment. In this embodiment, one method is dividing the Real pixel structure into several reference pixel groups, where each of the reference pixel groups includes two rows and three columns of six reference pixels in total, and each of the reference pixels includes three sub-pixels that are arranged side by side and that have different colors, and obtaining luminance of sub-pixels in the reference pixel groups. Moreover, the pixel structure is divided into several target pixel groups, where each target pixel group includes two pixel units (that is, two rows and two columns of four target pixels in total). Luminance of sub-pixels in the target pixel groups is determined according to the luminance of the sub-pixels in the reference pixel groups, to make a display effect of a target pixel group be equivalent to a display effect of a reference pixel group. In this way, two pixels in the pixel structure are used to achieve a display effect of three pixels in the Real pixel structure. For example, in a row direction, a total of 780 pixels can achieve a display effect of 1280 pixels in the Real pixel structure, thereby increasing a virtual resolution.

Referring to FIG. 15 (a), one reference pixel group includes two rows and three columns of six reference pixels P11', P12', P13', P21', P22', and P23' in total. Each reference pixel includes three sub-pixels that are arranged side by side. Sub-pixels in the reference pixels P11', P12', and P13' are arranged in one row, and sub-pixels in the reference pixels P21', P22', and P23' are arranged in another row.

For ease of description, in a reference pixel group P0', in a reference pixel P11' that is in the first row and the first column, a red sub-pixel is denoted as R11', a green sub-pixel is denoted as G11', and a blue sub-pixel is denoted as B11'; in a reference pixel P12' that is in the first row and the second column, a red sub-pixel is denoted as R12', a green sub-pixel is denoted as G12', and a blue sub-pixel is denoted as B12'; in a reference pixel P21' that is in the second row and the first column, a red sub-pixel is denoted as R21', a green sub-pixel is denoted as G21', and a blue sub-pixel is denoted as B21'; and in a reference pixel P22' that is in the second row and the second column, a red sub-pixel is denoted as R22', a green sub-pixel is denoted as G22', and a blue sub-pixel is denoted as B22', and so on.

Referring to FIG. 15 (b), a target pixel group includes two pixel units P1 and P2. The pixel unit P1 includes two pixels P11 and P21. The pixel unit P2 includes two pixels P12 and P22. The pixels P11 and the P12 are arranged side by side in a same row, and the pixels P21 and P22 are arranged side by side in same row. Each of the pixels P11, P12, P21, and P22 includes three sub-pixels that have different colors and virtual connection lines of centers of the three sub-pixels comprise a triangular shape.

For ease of description, in a target pixel group P0, in a target pixel P11, a red sub-pixel is denoted as R11, a green sub-pixel is denoted as G11, and a blue sub-pixel is denoted as B11; in a target pixel P12, a red sub-pixel is denoted as R12, a green sub-pixel is denoted as G12, and a blue sub-pixel is denoted as B12; in a target pixel P21, a red sub-pixel is denoted as R21, a green sub-pixel is denoted as G21, and a blue sub-pixel is denoted as B21; and in a target pixel P22, a red sub-pixel is denoted as R22, a green sub-pixel is denoted as G22, and a blue sub-pixel is denoted as B22.

Figure 16:
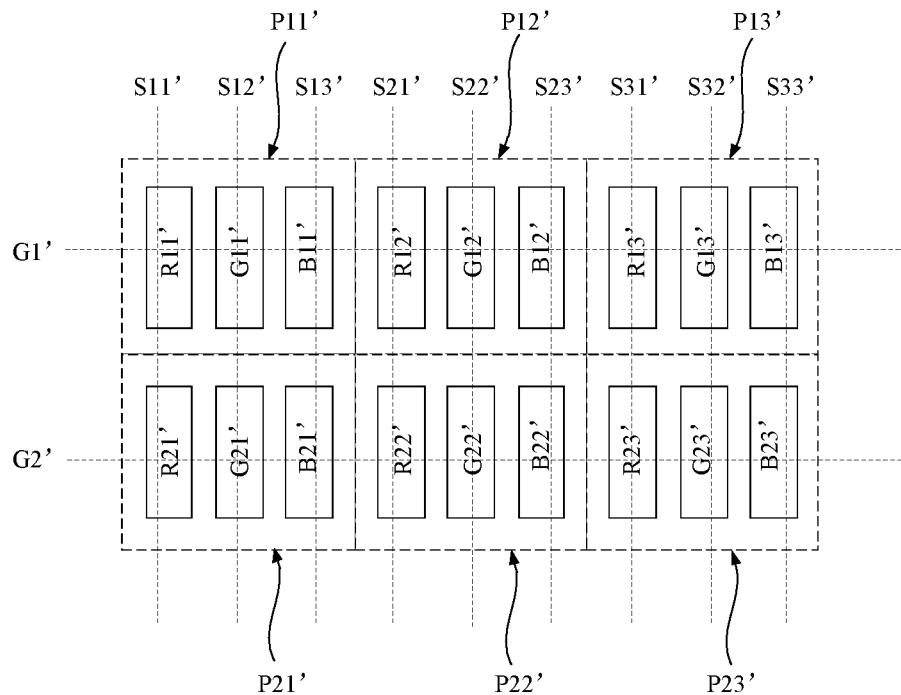
FIG. 16 is a schematic diagram of a reference pixel unit connecting gate lines and data lines according to an embodiment of the present disclosure.

As shown in FIG. 15 (a) and FIG. 16, the reference pixel P11' is controlled by a gate line G1' and data lines S11', S12', and S13'. The reference pixel P12' is controlled by the gate line G1' and data lines S21', S22', and S23'. The reference pixel P13' is controlled by the gate line G1' and data lines S31', S32', and S33'. The reference pixel P21' is controlled by a gate line G2' and the data lines S11', S12', and S13'. The reference pixel P22' is controlled by the gate line G2' and the data lines S21', S22', and S23'. The reference pixel P23' is controlled by the gate line G2' and the data lines S31', S32', and S33'. As can be seen, each of the six reference pixels P11', P12', P13', P21', P22', and P23' is constituted as a rectangular shape.

Figure 17:
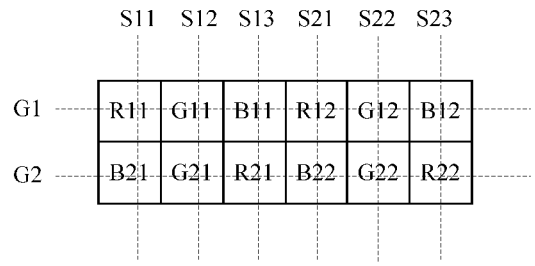
FIG. 17 is a schematic diagram of a pixel unit connecting gate lines and data lines according to an embodiment of the present disclosure.
Figure 18:
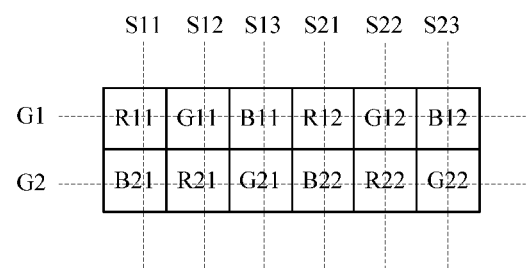
FIG. 18 is a schematic diagram of another pixel unit connecting gate lines and data lines according to an embodiment of the present disclosure.

As shown in FIG. 15 (b), FIG. 17, and FIG. 18, the target pixel P11 is controlled by a gate line G1 and data lines S11, S12, and S13. The target pixel P12 is controlled by the gate line G1 and data lines S21, S22, and S23. The target pixel P21 is controlled by a gate line G2 and the data lines S11, S12, and S13. The target pixel P22 is controlled by the gate line G2 and the data lines S21, S22, and S23. For example, this is implemented by the following two methods.

Referring to FIG. 17, one method is that R11, G11, B11, R12, G12, and B12 are controlled by the gate line G1 and the data lines S11, S12, S13, S21, S22, and S23. B21, G21, R21, B22, G22, and R22 are controlled by the gate line G2 and the data lines S11, S12, S13, S21, S22, and S23.

Referring to FIG. 18, the other method may be that R11, G11, B11, R12, G12, and B12 are controlled by the gate line G1 and the data lines S11, S12, S13, S21, S22, and S23. B21, R21, G21, B22, R22, and G22 are controlled by the gate line G2 and the data lines S11, S12, S13, S21, S22, and S23.

The four pixels in the target pixel group need to undertake luminance of the six pixels in the reference pixel group, that is, three adjacent reference pixels in a row direction in the reference pixel group are combined to be two pixels in the target pixel group for display so that the two pixels achieve a display effect of the three reference pixels. Therefore, after luminance of each sub-pixel in the reference pixel group is determined, the luminance needs to be allocated to the target reference pixel. For example, the following allocation method may be used: luminance of the pixels P12' and P22' in the middle column are equally divided into two parts; the target pixels P11 and P12 in an odd-numbered row undertake luminance of the reference pixels P11' and P13' and a half of luminance of the reference pixel P12'; the target pixels P21 and P22 in an even-numbered row undertake luminance of the reference pixels P21' and P23' and a half of luminance of the reference pixel P22'.

A sub-pixel B12' of the reference pixel P12' in FIG. 15 (a) is used as an example, and a half of luminance of the sub-pixel B12' may be allocated to the sub-pixel B11 in the adjacent target pixel P11 for display.

A specific luminance allocation method is as follows.

(1) in an Odd-Numbered Row $L_{11r} = L'_{11r}$;
$L_{11g} = L'_{11g}$;
$L_{11b} = L'_{11b} + L'_{12b}/2$;
$L_{12r} = L'_{13r} + L'_{12r}/2$;
$L_{12g} = L'_{13g} + L'_{12g}/2$; and
$L_{12b} = L'_{13b}$, where $L_{11r}$, $L_{11g}$, $L_{11b}$, $L_{12r}$, $L_{12g}$, and $L_{12b}$ refer to luminance values of the sub-pixels R11, G11, B11, R12, G12, and B12 in the target pixel group; and $L'_{11r}$, $L'_{11g}$, $L'_{11b}$, $L'_{12r}$, $L'_{12g}$, $L'_{12b}$, $L'_{13r}$, $L'_{13g}$, and $L'_{13b}$ refer to luminance values of the sub-pixels R11', G11', B11', R12', G12', B12', R13', G13', and B13' in the reference pixel group.

(2) In an Even-Numbered Row $L_{21r} = L'_{21r} + L'_{22r}/2$;
$L_{21g} = L'_{21g} + L'_{22g}/2$;
$L_{21b} = L'_{21b}$;
$L_{22r} = L'_{23r}$;
$L_{22g} = L'_{23g}$; and
$L_{22b} = L'_{23b} + L'_{22b}/2$, where $L_{21r}$, $L_{21g}$, $L_{21b}$, $L_{22r}$, $L_{22g}$, and $L_{22b}$ refer to luminance values of the sub-pixels R21, G21, B21, R22, G22, and B22 in the target pixel group; and $L'_{21r}$, $L'_{21g}$, $L'_{21b}$, $L'_{22r}$, $L'_{22g}$, $L'_{22b}$, $L'_{23r}$, $L'_{23g}$, and $L'_{23b}$ refer to luminance values of the sub-pixels R21', G21', B21', R22', G22', B22', R23', G23', and B23' in the reference pixel group.

Each of the foregoing formulas is a calculation for luminance, a luminance value $L_{um}$ and a grey scale value Gray have a relationship as follows:

$$L_{um} = (Gray/255)^{2.2}.$$

To save a calculation time, a grey scale value may be obtained in a table lookup manner.

When N=2, $Y_1 = 4/3 X_1$. Another driving method may be alternatively used, to enable 2M pixels in a row direction to achieve a display effect of 3M pixels in the Real pixel structure.

That is, when pixels in the pixel structure in a direction are configured to be equivalent to 3/2 times of pixels in the Real pixel structure, pixel borrowing can be implemented by the following method:

a third sub-pixel in an mth row and an ith column in the pixel structure undertakes luminance of a third sub-pixel in an mth row and a ((3*i−1)/2)th column and a third sub-pixel in the mth row and a ((3*i+1)/2)th column in the Real pixel structure;

a second sub-pixel in the mth row and a jth column in the pixel structure undertakes luminance of a second sub-pixel in the mth row and a (3*j/2−1)th column and a second sub-pixel in the mth row and a (3*j/2)th column in the Real pixel structure;

a first sub-pixel in the mth row and the jth column in the pixel structure undertakes luminance of a first sub-pixel in the mth row and the (3*j/2−1)th column and a first sub-pixel in the mth row and the (3*j/2)th column in the Real pixel structure;

a first sub-pixel in an nth row and the ith column in the pixel structure undertakes luminance of a first sub-pixel in an nth row and the ((3*i−1)/2)th column and a first sub-pixel in the nth row and the ((3*i+1)/2)th column in the Real pixel structure;

a second sub-pixel in the nth row and the ith column in the pixel structure undertakes luminance of a second sub-pixel in the nth row and the ((3*i−1)/2)th column and a second sub-pixel in the nth row and the ((3*i+1)/2)th column in the Real pixel structure; and a third sub-pixel in the nth row and the jth column in the pixel structure undertakes luminance of a third sub-pixel in the nth row and the (3*j/2−1)th column and a third sub-pixel in the nth row and the (3*j/2)th column in the Real pixel structure, where m and i are odd numbers, and n and j are even numbers.

Figure 19:
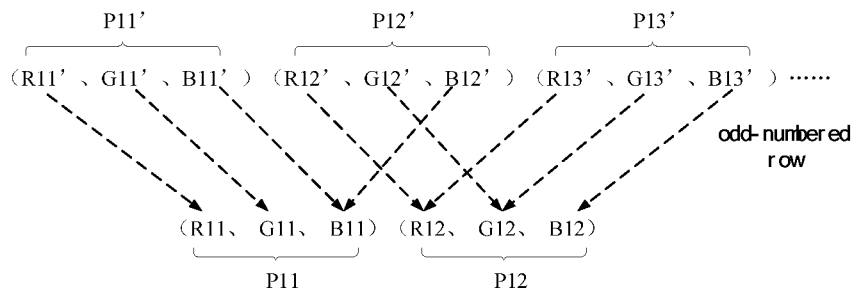
FIG. 19 is another schematic equivalent diagram according to an embodiment of the present disclosure.
Figure 19:
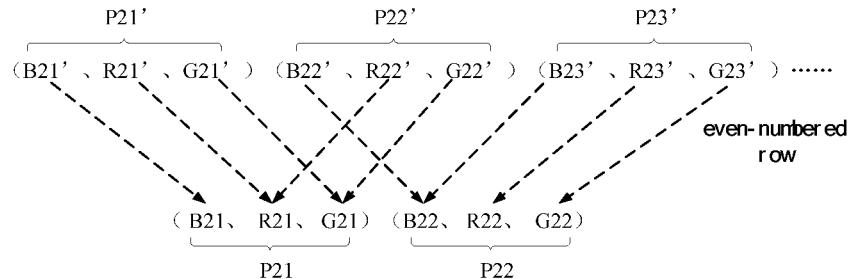

The following describes in detail the driving method with reference to FIG. 19.

(1) In an Odd-Numbered Row

In accordance with sequences of data lines (source line), sub-pixels of R, G, B, R, G, B, . . . are sequentially arranged, R, G and B constitute a pixel, and representation of three pixels is implemented by using two pixels through sub-pixel borrowing. That is, two target pixels P11 and P12 are equivalent to three reference pixels P11', P12', and P13'.

With reference to those shown in FIG. 19, a specific luminance allocation method is as follows.

In the target pixel P11, the red sub-pixel R11 undertakes luminance of the red sub-pixel R11' in the reference pixel P11', the green sub-pixel G11 undertakes luminance of the green sub-pixel G11' in the reference pixel P11', and the blue sub-pixel B11 undertakes luminance of the blue sub-pixel B11' in the reference pixel P11' and luminance of the blue sub-pixel B12' in the reference pixel P12'.

In the target pixel P12, the red sub-pixel R12 undertakes luminance of the red sub-pixel R12' in the reference pixel P12' and the red sub-pixel R13' in the reference pixel P13', the green sub-pixel G12 undertakes luminance of the green sub-pixel G12' in the reference pixel P12' and the green sub-pixel G13' in the reference pixel P13', and the blue sub-pixel B12 undertakes luminance of the blue sub-pixel B13' in the reference pixel P13'.

When in an odd-numbered row, a sub-pixel in a target pixel undertakes luminance of two corresponding sub-pixels in a reference pixel, luminance distribution coefficients of the two sub-pixels are further required to be considered. Assuming that in the reference pixel, luminance of a sub-pixel is L1, and luminance of another sub-pixel is L2, a luminance value $L_{um}'$ of the sub-pixel in the target pixel may be:

$$L_{um}' = L1*L1/(L1+L2) + L2*L2/(L1+L2).$$

Specifically, for example, a processing method for sub-pixels having a borrowing relationship in an odd-numbered row is as follows:

For the blue sub-pixel, $L1 = L_{umB}(m,(3*i−1)/2)$; and $L2 = L_{umB}(m,(3*i+1)/2)$, where When each of the L1 and L2 is equal to 0, $L_{umB}(m, i)'=0$; and when L1 or L2 is not equal to 0, $L_{umB}(m, i)'=L1*L1/(L1+L2)+L2*L2/(L1+L2)$.

For the red sub-pixel, $L1=L_{umR}(m,(3*j/2-1))$; and $L2=L_{umR}(m,3*j/2)$, where when each of the L1 and L2 is equal to 0, $L_{umR}(m, j)'=0$; and when L1 or L2 is not equal to 0, $L_{umR}(m, y=L1*L1/(L1+L2)+L2*L2(L1+L2)$.

For the green sub-pixel, $L1=L_{umG}(m,(3*j/2-1))$; and $L2=L_{umG}(m,3*j/2)$, where when each of the L1 and L2 is equal to 0, $L_{umG}(m, j)'=0$; and when L1 or L2 is not equal to 0, $L_{umG}(m, y=L1*L1/(L1+L2)+L2*L2(L1+L2)$.

m represents a row number, i and j represent column numbers, m and i are odd numbers, j is an even number, and L1 and L2 are luminance values in the reference pixel. Specifically, $L_{umB}(m, (3*i-1)/2)$ is a luminance value of a blue sub-pixel in an mth row and a $((3*i-1)/2)$th column in the reference pixel. $L_{umB}(m, (3*i+1)/2)$ is a luminance value of a blue sub-pixel in the mth row and a $((3*i+1)/2)$th column in the reference pixel. $L_{umR}(m, (3*j/2-1))$ is a luminance value of a red sub-pixel in the mth row and a $(3*j/2-1)$th column in the reference pixel. $L_{umR}(m, 3*j/2)$ is a luminance value of a red sub-pixel in the mth row and a $(3*j/2)$th column in the reference pixel. $L_{umG}(m, (3*j/2-1))$ is a luminance value of a green sub-pixel in the mth row and the $(3*j/2-1)$th column in the reference pixel. $L_{umG}(m, 3*j/2)$ is a luminance value of a green sub-pixel in the mth row and the $(3*j/2)$th column in the reference pixel. $L_{umB}(m, i)'$ is a luminance value of a blue sub-pixel in an mth row and an ith column in the target pixel. $L_{umR}(m, i)'$ is a luminance value of a red sub-pixel in the mth row and the ith column in the target pixel. $L_{umG}(m, i)'$ is a luminance value of a green sub-pixel in the mth row and the ith column in the target pixel.

(2) In an Even-Numbered Row

As shown in FIG. 19, in accordance with sequences of data lines (source line), sub-pixels of B, R, G, B, R, G, ... are sequentially arranged, B, R and G constitute a pixel, and representation of three pixels is implemented by using two pixels through sub-pixel borrowing. That is, two target pixels P21 and P22 are equivalent to three reference pixels P21', P22', and P23'.

For an even-numbered row, in each pixel unit, in a pixel in the pixel unit, a first sub-pixel undertakes luminance of first sub-pixels in two adjacent reference pixels, a second sub-pixel undertakes luminance of second sub-pixels in two adjacent reference pixels, and a third sub-pixel undertakes luminance of third sub-pixel in one reference pixel. In another pixel, a first sub-pixel and a second sub-pixel undertake luminance of a first sub-pixel and a second sub-pixel in a reference pixel, and a third sub-pixel undertakes luminance of third sub-pixels in two adjacent reference pixels.

A specific allocation method is as follows.

In the target pixel P21, the blue sub-pixel B21 undertakes luminance of the blue sub-pixel B21' in the reference pixel P21', the red sub-pixel R21 undertakes luminance of the red sub-pixel R21' in the reference pixel P21' and the red sub-pixel R22' in the reference pixel P22', and the green sub-pixel G21 undertakes luminance of the green sub-pixel G21' in the reference pixel P21' and the green sub-pixel G22' in the reference pixel P22'.

In the target pixel P22, the blue sub-pixel B22 undertakes luminance of the blue sub-pixel B22' in the reference pixel P22' and the blue sub-pixel B23' in the reference pixel P23', the red sub-pixel R22 undertakes luminance of the red sub-pixel R23' in the reference pixel P23', and the green sub-pixel G22 undertakes luminance of the green sub-pixel G23' in the reference pixel P23'.

When in an even-numbered row, a sub-pixel in a target pixel undertakes luminance of two corresponding sub-pixels in a reference pixel, luminance distribution coefficients of the two sub-pixels are further required to be considered. Assuming that in the reference pixel, luminance of a sub-pixel is L1, and luminance of another sub-pixel is L2, a luminance value $L_{um}'$ of the target pixel may be: $L_{um}'=L1*L1/(L1+L2)+L2*L2/(L1+L2)$.

Specifically, for example, a processing method of sub-pixels having a borrowing relationship in an even-numbered row is as follows.

For the red sub-pixel, $L1=L_{umR}(n,(3*i-1)/2)$; and $L2=L_{umR}(n,(3*i+1)/2)$, where when each of the L1 and L2 is equal to 0, $L_{umR}(n, i)'=0$; and when L1 or L2 is not equal to 0, $L_{umR}(n, i)'=L1*L1/(L1+L2)+L2*L2(L1+L2)$.

For the green sub-pixel, $L1=L_{umG}(n,(3*i-1)/2)$; and $L2=L_{umG}(n,(3*i+1)/2)$, where when each of the L1 and L2 is equal to 0, $L_{umG}(n, i)'=0$; and when L1 or L2 is not equal to 0, $L_{umG}(n, i)'=L1*L1/(L1+L2)+L2*L2(L1+L2)$.

For the blue sub-pixel, $L1=L_{umB}(n,(3*j/2-1))$; and $L2=L_{umB}(n,3*j/2)$; where when each of the L1 and L2 is equal to 0, $L_{umB}(n, j)'=0$; and when L1 or L2 is not equal to 0, $L_{umB}(n, y=L1*L1/(L1+L2)+L2*L2(L1+L2)$.

n represents a row number, i and j represent column numbers, n is an even number, i is an odd number, j is an even number, and L1 and L2 represent luminance values in the reference pixel. Specifically, $L_{umR}(n, (3*i-1)/2)$ is a luminance value of a red sub-pixel in an nth row and a $((3*i-1)/2)$th column in the reference pixel. $L_{umR}(n, (3*i+1)/2)$ is a luminance value of a red sub-pixel in the nth row and a $((3*i+1)/2)$th column in the reference pixel. $L_{umG}(n, (3*i-1)/2)$ is a luminance value of a green sub-pixel in the nth row and the $((3*i-1)/2)$th column in the reference pixel. $L_{umG}(n, (3*i+1)/2)$ is a luminance value of a green sub-pixel in the nth row and the $((3*i+1)/2)$th column in the reference pixel. $L_{umB}(n, (3*j/2-1))$ is a luminance value of a blue sub-pixel in the nth row and a $(3*j/2-1)$th column in the reference pixel. $L_{um}G$ $L_{umB}(n, 3*j/2)$ is a luminance value of a blue sub-pixel in the nth row and a $(3*j/2)$th column in the reference pixel. $L_{umR}(n, i)'$ represents a luminance value of a red sub-pixel in the nth and an ith column in the target pixel. $L_{umG}(n, i)'$ represents a luminance value of a green sub-pixel in the nth and the ith column in the target pixel. $L_{umB}(n, j)'$ represents a luminance value of a blue sub-pixel in the nth and a jth column in the target pixel.

Certainly, when a sub-pixel in the target pixel undertakes luminance of two corresponding sub-pixels in the reference pixel, a maximum value or an average value of luminance of the two sub-pixels may alternatively be directly used for display, and the following method may be further used for display:

$$L_{um} = L1 * x + L2 * y, \text{ where}$$

$$x + y = 1.$$

For example, x=0.3, and y=0.7.

For the pixel structure, this embodiment further provides another pixel structure driving method, where each pixel unit has two pixels in a Y direction, and has one pixel in an X direction. In addition, M pixels in a row direction are made to achieve a display effect of 2M pixels in the Real pixel structure. That is, a quantity of pixels in the X direction is compressed to ½.

In this case, when N=1, pitches in the X and Y directions have the following relationship:

$$Y_1/2 = X_1/2.$$

That is, $Y_1 = X_1$.

In this way, pixels in the pixel structure in a direction may be made to be equivalent to twice pixels in the Real pixel structure so as to increase a virtual resolution.

Borrowing relationships between sub-pixels are as follows:

when i=1, a second sub-pixel in an mth row and an ith column in the pixel structure undertakes luminance of a second sub-pixel in an mth row and an ith column in the Real pixel structure;

when 2≤i≤W/2, the second sub-pixel in the mth row and the ith column in the pixel structure undertakes luminance of a second sub-pixel in the mth row and a (2i−2)th column and a second sub-pixel in the mth row and a (2i−1)th column in the Real pixel structure;

when i=1, a first sub-pixel in the mth row and the ith column in the pixel structure undertakes luminance of a first sub-pixel in the mth row and the ith column in the Real pixel structure;

when 2≤i≤W/2, the first sub-pixel in the mth row and the ith column in the pixel structure undertakes luminance of a first sub-pixel in the mth row and the (2i−2)th column and a first sub-pixel in the mth row and the (2i−1)th column in the Real pixel structure;

when 1≤i≤W/2, a third sub-pixel in the mth row and the ith column in the pixel structure undertakes luminance of a third sub-pixel in the mth row and the (2i−1)th column and a third sub-pixel in the mth row and a (2i)th column in the Real pixel structure;

when i=1, a third sub-pixel in an nth row and the ith column in the pixel structure undertakes luminance of a third sub-pixel in an nth row and the ith column in the Real pixel structure;

when 2≤i≤W/2, the third sub-pixel in the nth row and the ith column in the pixel structure undertakes luminance of a third sub-pixel in the nth row and the (2i−2)th column and a third sub-pixel in the nth row and the (2i−1)th column in the Real pixel structure;

when 1≤i≤W/2, a second sub-pixel in the nth row and the ith column in the pixel structure undertakes luminance of a second sub-pixel in the nth row and the (2i−1)th column and a second sub-pixel in the nth row and the (2i)th column in the Real pixel structure; and when 1≤i≤W/2, a first sub-pixel in the nth row and the ith column in the pixel structure undertakes luminance of a first sub-pixel in the nth row and the (2i−1)th column and a first sub-pixel in the nth row and the (2i)th column in the Real pixel structure, where m and i are odd numbers, n is an even number, I=W/2, there are W columns×H rows of pixels in total in the Real pixel structure, and there are I columns×H rows of pixels in total in the pixel structure.

Figure 20:
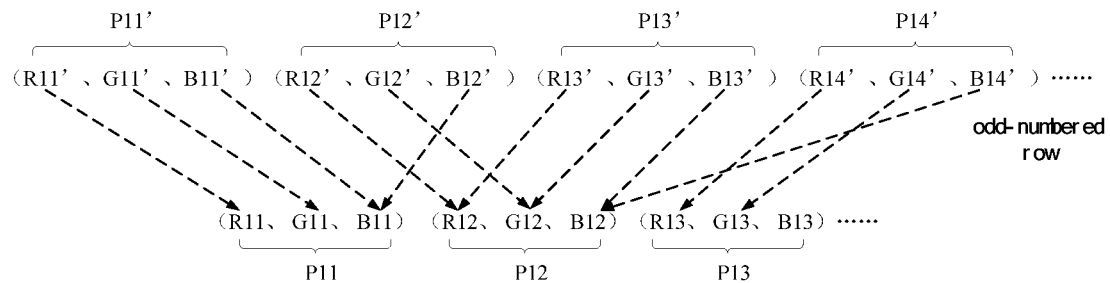
FIG. 20 is a further schematic equivalent diagram according to an embodiment of the present disclosure.
Figure 20:
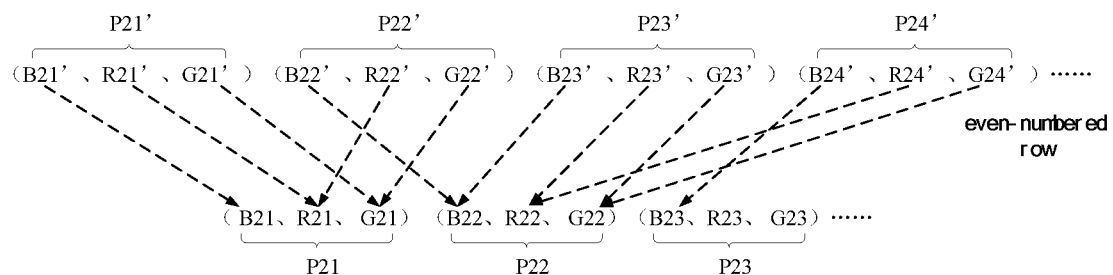

The following describes in detail the driving method with reference to FIG. 20.

(1) In an Odd-Numbered Row

As show in FIG. 20, in accordance with sequences of data lines (source line), sub-pixels of R, G, B, R, G, B, . . . are sequentially arranged, R, G and B constitute a pixel, and representation of two pixels is implemented by using one pixel through sub-pixel borrowing.

A specific allocation method is as follows.

In the target pixel P11, the red sub-pixel R11 undertakes luminance of the red sub-pixel R11' in the reference pixel P11', the green sub-pixel G11 undertakes luminance of the green sub-pixel G11' in the reference pixel P11', and the blue sub-pixel B11 undertakes luminance of the blue sub-pixel B11' in the reference pixel P11' and the blue sub-pixel B12' in the reference pixel P12'.

In the target pixel P12, the red sub-pixel R12 undertakes luminance of the red sub-pixel R12' in the reference pixel P12' and the red sub-pixel R13' in the reference pixel P13', the green sub-pixel G12 undertakes luminance of the green sub-pixel G12' in the reference pixel P12' and the green sub-pixel G13' in the reference pixel P13', and the blue sub-pixel B12 undertakes luminance of the blue sub-pixel B13' in the reference pixel P13' and the blue sub-pixel B14' in the reference pixel P14'.

Borrowing of sub-pixels in odd-numbered rows is completed by analogy.

When in an odd-numbered row, a sub-pixel in a target pixel undertakes luminance of two corresponding sub-pixels in a reference pixel, luminance distribution coefficients of the two sub-pixels are further required to be considered. One method is that a processing method for sub-pixels having a borrowing relationship in the odd-numbered row is: obtaining an average value of luminance values of two sub-pixels that are undertaken, which is specifically as follows:

$$LR(m, i) = \begin{cases} L_{umR}(m, i) & i = 1 \\ (L_{umR}(m, (2 \times l - 2)) + L_{umR}(m, (2 \times l - 1))) \div 2 & i \in \left(2, \frac{w}{2}\right) \end{cases}$$

$$LR(m, i) = \begin{cases} L_{umG}(m, i) & i = 1 \\ (L_{umG}(m, (2 \times l - 2)) + L_{umG}(m, (2 \times l - 1))) \div 2 & i \in \left(2, \frac{w}{2}\right) \end{cases}$$

$$LB(m, i) = (L_{umB}(m, (2 \times i - 1)) + L_{umB}(m, (2 \times i))) \div 2 \qquad i \in \left(1, \frac{w}{2}\right)$$

where m represents a row number, i represents a column number, m is an odd number. A data input resolution is W×H (for example, 1280*640). LR(m, i) is a luminance value of a red sub-pixel in an mth row and an ith column in a target pixel. LG(m, i) is a luminance value of a green sub-pixel in the mth row and the ith column in the target pixel. LB(m, i) is a luminance value of a blue sub-pixel in the mth row and the ith column in the target pixel. $L_{umR}(m, i)$ is a luminance value of a red sub-pixel in an mth row and an ith column in a reference pixel. $L_{umG}(m, i)$ is a luminance value of a green sub-pixel in the mth row and the ith column in the reference pixel. And $L_{umB}$(m, i) is a luminance value of a blue sub-pixel in the mth row and the ith column in the reference pixel.

(2) In an Even-Numbered Row

As show in FIG. 20, in accordance with sequences of data lines (source line), sub-pixels of B, R, G, B, R, G, . . . are sequentially arranged, R, G and B constitute a pixel, and representation of two pixels is implemented by using one pixel through sub-pixel borrowing.

A specific allocation method is as follows.

In the target pixel P21, the blue sub-pixel B21 undertakes luminance of the blue sub-pixel B21' in the reference pixel P21', the red sub-pixel R21 undertakes luminance of the red sub-pixel R21' in the reference pixel P21' and the red sub-pixel R22' in the reference pixel P22', and the green sub-pixel G21 undertakes luminance of the green sub-pixel G21' in the reference pixel P21' and the green sub-pixel G22' in the reference pixel P22'.

In the target pixel P22, the blue sub-pixel B22 undertakes luminance of the blue sub-pixel B22' in the reference pixel P22' and the in blue sub-pixel B23' in the reference pixel P23', the red sub-pixel R22 undertakes luminance of the red sub-pixel R23' in the reference pixel P23' and the red sub-pixel R24' in the reference pixel P24', and the green sub-pixel G22 undertakes luminance of the green sub-pixel G23' in the reference pixel P23' and the green sub-pixel G24' in the reference pixel P24'.

Borrowing of sub-pixels in even-numbered rows is completed by analogy.

Similarly, when in an even-numbered row, a sub-pixel in a target pixel undertakes luminance of two corresponding sub-pixels in a reference pixel, luminance distribution coefficients of the two sub-pixels are further required to be considered. One method is that a processing method for sub-pixels having a borrowing relationship in the odd-numbered row is: obtaining an average value of luminance values of two sub-pixels that are undertaken, which is specifically as follows:

$$LB(n, i) = \begin{cases} L_{umB}(n, i) & i = 1 \\ (L_{umB}(n, (2 \times i - 2)) + L_{umB}(n, (2 \times i - 1))) \div 2 & i \in \left(2, \frac{w}{2}\right) \end{cases}$$

$$LR(n, i) = (L_{umR}(n, (2 \times i - 2)) + L_{umR}(n, (2 \times i))) \div 2 \quad i \in \left(1, \frac{w}{2}\right)$$

$$LG(n, i) = (L_{umG}(n, (2 \times i - 1)) + L_{umG}(n, (2 \times i))) \div 2 \quad i \in \left(1, \frac{w}{2}\right)$$

where n represents a row number, i represents a column number, n is an even number. A data input resolution is W×H (for example, 1280*640), LB(n, i) is a luminance value of a blue sub-pixel in an nth row and an ith column in a target pixel. LR(n, i) is a luminance value of a red sub-pixel in the nth row and the ith column in the target pixel, and LG(n, i) is a luminance value of a green sub-pixel in the nth row and the ith column in the target pixel.

When N=1, $Y_1=X_1$, another driving method may be alternatively used to enable M pixels in a row direction to achieve a display effect of 2M pixels in the Real pixel structure. With reference to those shown in FIG. 21, the following two driving methods may be used.

(1) Pixels in the pixel structure only undertake luminance of a half of the sub-pixels in the Real pixel structure, and the other half of the sub-pixels are omitted and are not displayed. For example, sub-pixels with dashed line boxes in FIG. 21 (a) are omitted and are not displayed. That is, the blue sub-pixel B11' in the reference pixel P11', the red sub-pixel R21' and the green sub-pixel G21' in the reference pixel P21', the red sub-pixel R12' and the green sub-pixel G12' in the reference pixel P12', the blue sub-pixel B22' in the reference pixel P22', the blue sub-pixel B13' in the reference pixel P13', the red sub-pixel R23' and the green sub-pixel G23' in the reference pixel P23', the red sub-pixel R14' and the green sub-pixel G14' in the reference pixel P14', and the blue sub-pixel B24' in the reference pixel P24' are omitted and are not displayed. Accordingly, one pixel is enabled to achieve a display effect of two reference pixels.

Figure 21:
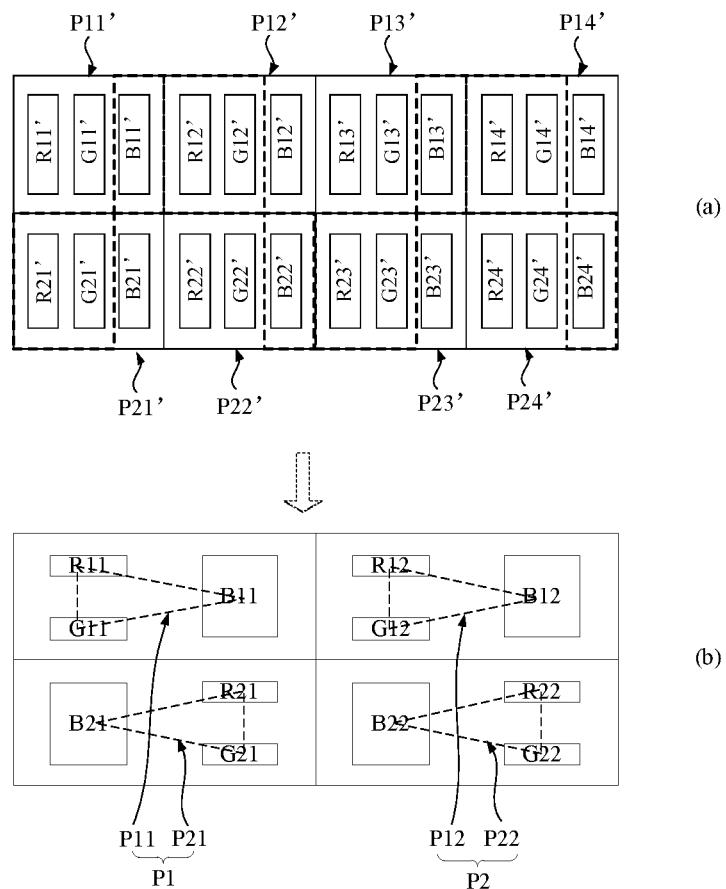
FIG. 21 is a further schematic equivalent diagram according to an embodiment of the present disclosure.

(2) Sub-pixels with dashed line boxes in FIG. 21 (a) are displayed by using luminance of a first proportion, sub-pixels without dashed line boxes are displayed by using luminance of a second proportion, and the second proportion and the first proportion are not equal. For example, the second proportion is greater than the first proportion, such as the first proportion is 30%, and the second proportion is 70%. In this way, a luminance difference of adjacent columns in a traverse direction can be ensured, and display of a single point is made to be not excessively distorted. Certainly, the first proportion and the second proportion may alternatively be equal, that is, proportions for display of luminance may alternatively be divided in half. In this way, same luminance of the adjacent two columns may easily lead to blur of the display details. Certainly, when a high PPI display is performed, a good display effect can still be obtained.

Figure 22:
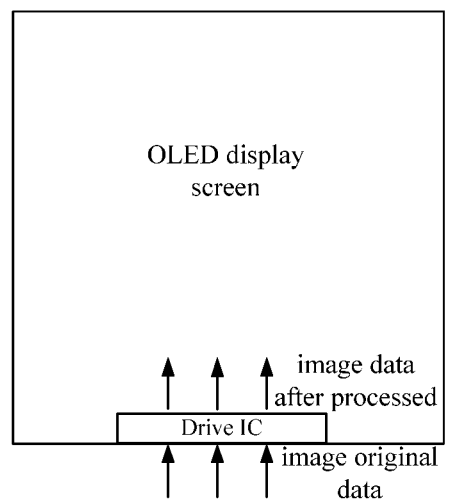
FIG. 22 is a schematic diagram of a display device according to an embodiment of the present disclosure.

As shown in FIG. 22, in an OLED display screen, a luminance value (that is, original image data) of each sub-pixel in a reference pixel may be calculated by using a drive IC, and processed image data is obtained by using the foregoing method, so that a sub-pixel in a target pixel is controlled to perform display by using a luminance value of a sub-pixel having a corresponding color in a reference pixel group after being processed, and further a display effect of M*(N+1)/N pixels in the Real pixel structure is achieved by M pixels.

Figure 23:
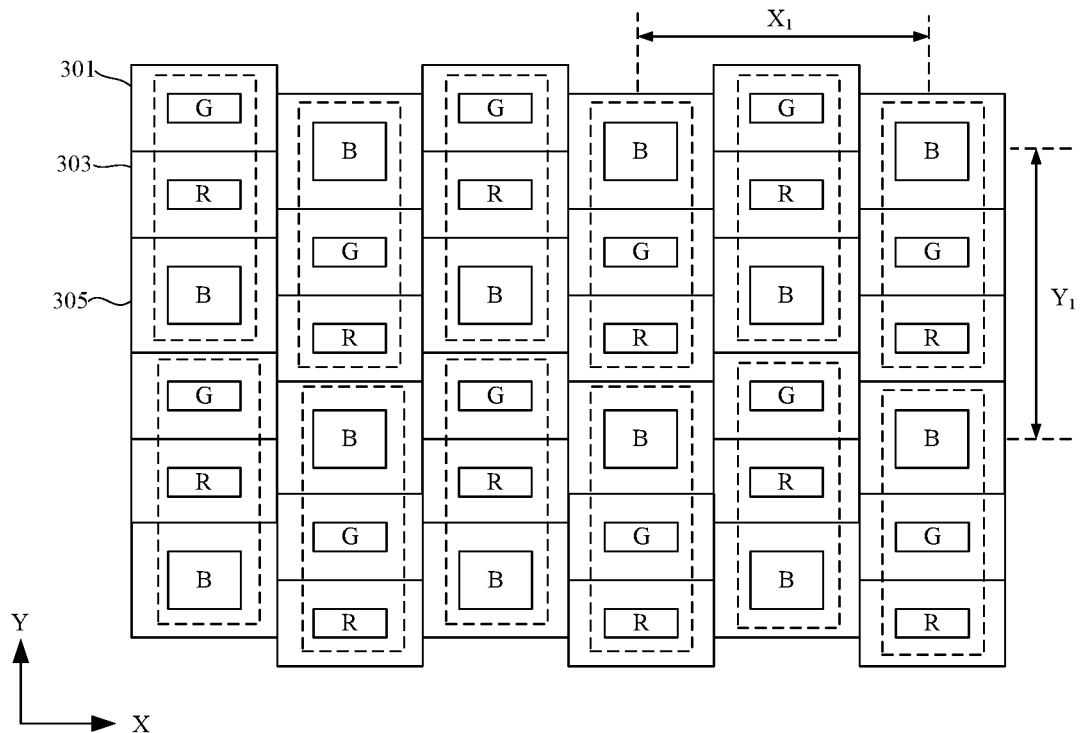
FIG. 23 is a schematic diagram of an arrangement of pixels of another OLED display device according to an embodiment of the present disclosure.
Figure 24:
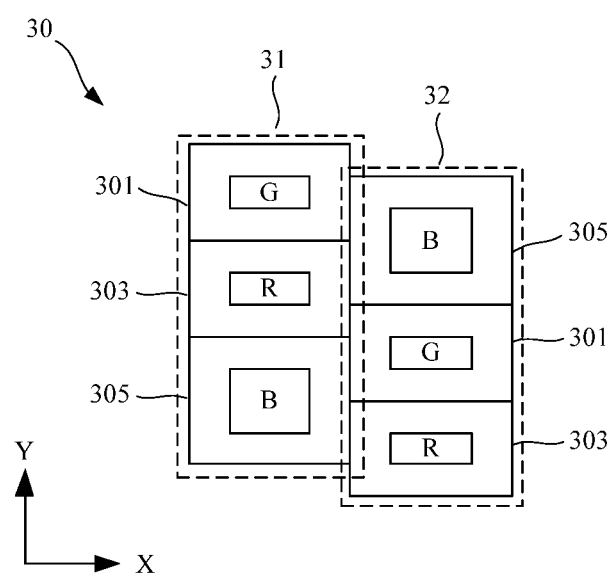
FIG. 24 is a schematic diagram of a pixel unit in FIG. 23.
Figure 25:
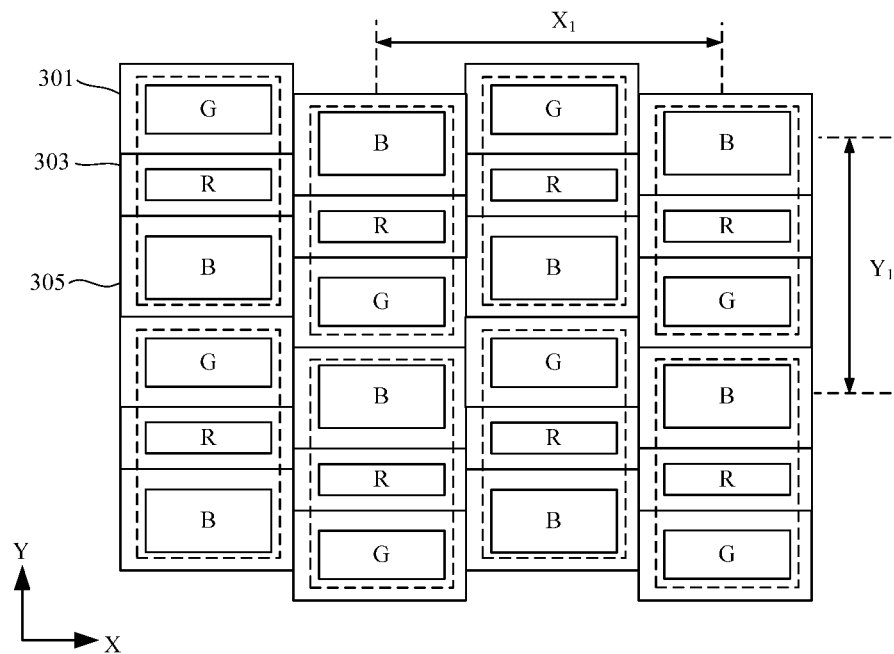
FIG. 25 is a schematic diagram of an arrangement of pixels of another OLED display device according to an embodiment of the present disclosure.
Figure 26:
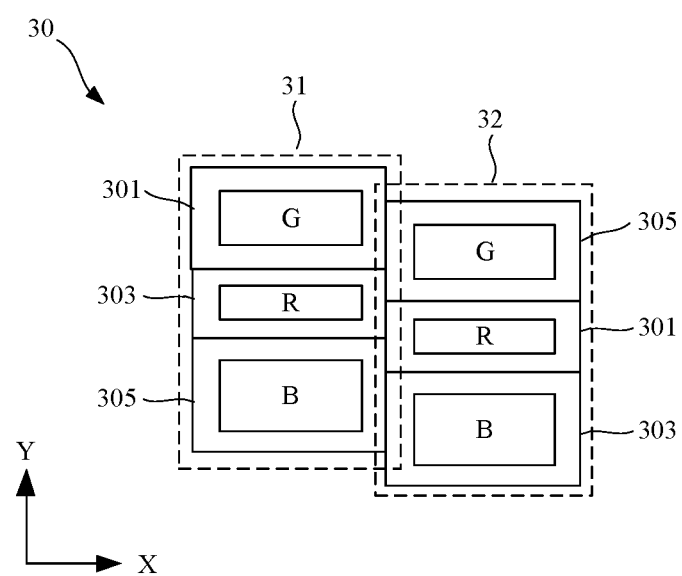
FIG. 26 is a schematic diagram of a pixel unit in FIG. 25.

The foregoing is a description provided by using an example in which the two pixel subunits constitute two pixels (each pixel includes a first sub-pixel, a second sub-pixel, and a third sub-pixel with different colors and virtual connection lines between centers of these three sub-pixels comprise a triangular shape) that are adjacently arranged along the second direction (the column direction), and M pixels in the first direction (the row direction) achieve a display effect of M*N(N+1) pixels in the Real pixel structure. However, it should be understood that, the two pixel subunits may alternatively constitute two pixels that are adjacently arranged along the first direction (the row direction), and one pixel in the second direction (the column direction) achieves a display effect of (N+1)/N pixels in the Real pixel structure. For example, as shown in FIG. 23 and FIG. 24, $X_1=Y_1$, that is, N=1. That is, M pixels in the column direction achieve a display effect of M*(N+1)/N pixels in the Real pixel structure. For another example, as shown in FIG. 25 and FIG. 26, $X_1=4/3Y_1$, that is, N=2. That is, two pixels in the column direction achieve a display effect of three pixels in the Real pixel structure. A principle of a driving method performed when pixels in the column direction are compressed is similar to a principle of the driving method performed when pixels in the row direction are compressed. A person skilled in the art may know how to perform the drive in combination with the foregoing description, and details are not described herein.

As can be seen, for any driving method described above, when a first sub-pixel, a second sub-pixel, or a third sub-pixel in a pixel in the pixel structure needs to undertake luminance of two sub-pixels having a corresponding color in the Real pixel structure, any one of the following methods may be used to implement borrowing.

(1) A maximum value or an average value of luminance of two sub-pixels having a corresponding color in the Real pixel structure is selected for display.

(2) $L_{um}=L1*L1/(L1+L2)+L2*L2/(L1+L2)$, where $L_{um}$ is a luminance value of the first sub-pixel, the second sub-pixel, or the third sub-pixel, and L1 and L2 are luminance values of the two sub-pixels having the corresponding color in the Real pixel structure.

(3) $L_{um}=L1*x+L2*y$, and $x+y=1$, where $L_{um}$ is a luminance value of the first sub-pixel, the second sub-pixel, or the third sub-pixel, and L1 and L2 are luminance values of the two sub-pixels having the corresponding color in the Real pixel structure.

In conclusion, based on the pixel structure described above, the present disclosure provides a pixel driving method matching the pixel structure. A conventional Real pixel structure is compressed, and M pixels in the pixel structure in a direction are configured to be equivalent to M*(N+1)/N pixels in the Real pixel structure, thereby a virtual resolution is increased. The pixel driving method is particularly applicable to high PPI pixel structures (where PPI is greater than 300), and experiments show that a higher PPI of a display screen indicates a better effect of the pixel structure and a driving method therefor.

Based on the same inventive concept, this embodiment further provides an OLED display device, including the pixel structure provided by the embodiments of the present disclosure. The display device may be any product or component such as a mobile phone, a tablet computer, a television, a display, a notebook computer, a digital photo frame, or a navigator that has a display function. Each of the other indispensable constituent parts of the display device should be understood to be included by a person of ordinary skill in the art, details are not described herein, and this should not be considered as a limitation to the present disclosure. For implementation of the display device, reference may be made to the embodiments of the foregoing organic electroluminescence display device, and repetition is omitted herein. Each pixel row in the pixel structure may be connected to one gate line, and each pixel column may be connected to one data line. Light-emitting regions of sub-pixels having a same color in odd-numbered rows and even-numbered rows are arranged in a mutually staggered manner in the pixel structure, and therefore data lines and gate lines each may comprise a bent shape.

The foregoing embodiments describe in detail the pixel structure and the driving method therefor in the present disclosure. However, it should be understood that the foregoing description is merely a description of preferred embodiments of the present disclosure, and constitutes no limitation on the scope of the present disclosure. Any change or modification made by a person of ordinary skill in the art based on the foregoing disclosed subject matter should fall within the protection scope of the claims. In addition, the embodiments of this specification are described in a progressive manner, and each embodiment focuses on differences from other embodiments. The same or similar parts between the embodiments may be referred to each other.

What is claimed is:

1. A pixel structure, comprising:
a plurality of pixel units arranged in a matrix form, each of the pixel units including two pixel subunits adjacently arranged along a first direction, each pixel subunit including three sub-pixels having different colors;
in each of the pixel units, one of the pixel subunits includes a first sub-pixel, a second sub-pixel, and a third sub-pixel, or a second sub-pixel, a first sub-pixel, and a third sub-pixel, sequentially arranged along a second direction, and the other one of the pixel subunits includes a third sub-pixel, a first sub-pixel, and a second sub-pixel, or a third sub-pixel, a second sub-pixel, and a first sub-pixel, sequentially arranged along the second direction; and
the two pixel subunits constitute two pixels adjacently arranged along the second direction, a distance between centers of any sub-pixels having a same color in the second direction being 2 or 2N/(N+1) times of a distance between centers of any sub-pixels having the same color in the first direction; or the two pixel subunits constitute two pixels adjacently arranged along the first direction, a distance between centers of any sub-pixels having a same color in the first direction being 2N/(N+1) times of a distance between centers of any sub-pixels having the same color in the second direction, where N is an integer greater than or equal to 1.

2. The pixel structure according to claim 1, wherein when the two pixel subunits constitute two pixels adjacently arranged along the second direction, the distance between the centers of any sub-pixels having the same color in the second direction is 1 or 4/3 times of the distance between the centers of any sub-pixels having the same color in the first direction.

3. The pixel structure according to claim 1, wherein when the two pixel subunits constitute two pixels adjacently arranged along the first direction, the distance between the centers of any sub-pixels having the same color in the first direction is 1 or 4/3 times of the distance between the centers of any sub-pixels having the same color in the second direction.

4. The pixel structure according to claim 1, wherein in the pixel unit, an arrangement structure of one of the pixels after being inverted 180 degrees along the first direction is the same as an arrangement structure of the other one of the pixels.

5. The pixel structure according to claim 1, wherein in a single pixel, a total size of the first sub-pixel and the second sub-pixel along the second direction is greater than or equal to a size of the third sub-pixel along the second direction.

6. The pixel structure according to claim 1, wherein first sub-pixels in pixels in a same row or a same column are arranged on a straight line, and second sub-pixels in the pixels in the same row or the same column are arranged on another straight line.

7. The pixel structure according to claim 1, wherein first sub-pixels and second sub-pixels in pixels in a same row or a same column are alternately arranged on a straight line.

8. The pixel structure according to claim 1, wherein shapes of the first sub-pixel, the second sub-pixel, and the third sub-pixel are at least one of a triangular shape, a quadrangular shape, a pentagonal shape, a hexagonal shape, and an octagonal shape.

9. The pixel structure according to claim 1, wherein the first sub-pixel and the second sub-pixel have a same shape.

10. The pixel structure according to claim 1, wherein the first sub-pixel, the second sub-pixel, and the third sub-pixel are respectively a green sub-pixel, a red sub-pixel, and a blue sub-pixel.

11. The pixel structure according to claim 10, wherein in a single pixel, an area of the blue sub-pixel is larger than an area of the red sub-pixel and an area of the green sub-pixel.

12. An Organic Light-Emitting Diode (OLED) display device, comprising the pixel structure according claim 1.

13. A driving method for the pixel structure according to claim 1, wherein N has a value of 2, the driving method comprising: pixels in the pixel structure in a direction being equivalent to 3/2 times of pixels in a Real pixel structure, obtaining corresponding relationships between sub-pixels in the pixel structure and sub-pixels in the Real pixel structure as well as luminance values of the sub-pixels in the Real pixel structure, determining luminance values of the sub-pixels in the pixel structure according to the luminance values of the sub-pixels in the Real pixel structure and the corresponding relationships.

14. The method according to claim 13, further comprising:
dividing the Real pixel structure into several reference pixel groups, each of the reference pixel groups including two rows and three columns of six reference pixels in total, each of the reference pixels including three sub-pixels arranged side by side and have different colors, and obtaining the luminance values of the sub-pixels in the Real pixel structure; and
dividing the pixel structure into several target pixel groups, each of the target pixel groups including two rows and two columns of four target pixels in total, each of the target pixel groups corresponding to one of the reference pixel groups.

15. The method according to claim 14, wherein luminance of reference pixels in a second column in the reference pixel group is equally divided, target pixels in a first row and a first column and in the first row and a second column undertake luminance of reference pixels in a first row and a first column, and in the first row and a third column as well as half of a luminance of a reference pixel in the first row and the second column, target pixels in a second row and the first column and in the second row and the second column undertake luminance of reference pixels in a second row and the first column, and in the second row and the third column as well as half of a luminance of a reference pixel in the second row and the second column.

16. The method according to claim 13, wherein:
a third sub-pixel in an mth row and an ith column in the pixel structure undertakes luminance of third sub-pixels in an mth row and a $((3*i-1)/2)$th column, and in the mth row and a $((3*i+1)/2)$th column in the Real pixel structure;
a second sub-pixel in the mth row and a jth column in the pixel structure undertakes luminance of second sub-pixels in the mth row and a $(3*j/2-1)$th column, and in the mth row and a $(3*j/2)$th column in the Real pixel structure;
a first sub-pixel in the mth row and the jth column in the pixel structure undertakes luminance of first sub-pixels in the mth row and the $(3*j/2-1)$th column, and in the mth row and the $(3*j/2)$th column in the Real pixel structure;
a first sub-pixel in an nth row and the ith column in the pixel structure undertakes luminance of first sub-pixels in an nth row and the $((3*i-1)/2)$th column, and in the nth row and the $((3*i+1)/2)$th column in the Real pixel structure;
a second sub-pixel in the nth row and the ith column in the pixel structure undertakes luminance of second sub-pixels in the nth row and the $((3*i-1)/2)$th column, and in the nth row and the $((3*i+1)/2)$th column in the Real pixel structure; and
a third sub-pixel in the nth row and the jth column in the pixel structure undertakes luminance of third sub-pixels in the nth row and the $(3*j/2-1)$th column, and in the nth row and the $(3*j/2)$th column in the Real pixel structure, and
wherein m and i are odd numbers, and n and j are even numbers.

17. The method according to claim 13, wherein when a first sub-pixel, a second sub-pixel or a third sub-pixel in the pixel structure is required to undertake luminance of two sub-pixels having a corresponding color in the Real pixel structure, the corresponding relationship is as follows:

$$L_{um}=L1*L1/(L1+L2)+L2*L2/(L1+L2),$$

$L_{um}$ representing a luminance value of the first sub-pixel, the second sub-pixel or the third sub-pixel, L1 and L2 representing luminance values of the two sub-pixels having the corresponding color in the Real pixel structure.

18. The method according to claim 13, wherein when a first sub-pixel, a second sub-pixel or a third sub-pixel in the pixel structure is required to undertake luminance of two sub-pixels having a corresponding color in the Real pixel structure, a maximum value or an average value of luminance of the two sub-pixels having the corresponding color in the Real pixel structure is selected for display.

19. The method according claim 13, wherein when a first sub-pixel, a second sub-pixel or a third sub-pixel in the pixel structure undertake luminance of two sub-pixels having a corresponding color in the Real pixel structure, the corresponding relationship is as follows:

$$L_{um}=L1*x+L2*y;\text{ and}$$

x+y=1, $L_{um}$ representing a luminance value of the first sub-pixel, the second sub-pixel or the third sub-pixel, L1 and L2 representing luminance values of the two sub-pixels having the corresponding color in the Real pixel structure.

* * * * *